(12) United States Patent
Cheon et al.

(10) Patent No.: US 11,651,941 B2
(45) Date of Patent: May 16, 2023

(54) APPARATUS FOR DISTRIBUTING GAS, AND APPARATUS AND METHOD FOR PROCESSING SUBSTRATE

(71) Applicant: JUSUNG ENGINEERING CO., LTD., Gwangju-si (KR)

(72) Inventors: Min Ho Cheon, Gwangju-si (KR); Jong Sik Kim, Gwangju-si (KR); Chul-Joo Hwang, Gwangju-si (KR)

(73) Assignee: JUSUNG ENGINEERING CO., LTD.

( * ) Notice: Subject to any disclaimer, the term of this patent is extended or adjusted under 35 U.S.C. 154(b) by 383 days.

(21) Appl. No.: 16/628,021

(22) PCT Filed: Jul. 18, 2018

(86) PCT No.: PCT/KR2018/008098
§ 371 (c)(1),
(2) Date: Dec. 31, 2019

(87) PCT Pub. No.: WO2019/022430
PCT Pub. Date: Jan. 31, 2019

(65) Prior Publication Data
US 2020/0219700 A1    Jul. 9, 2020

(30) Foreign Application Priority Data

Jul. 28, 2017  (KR) .......... 10-2017-0096375
Aug. 11, 2017  (KR) .......... 10-2017-0102535
Jul. 16, 2018  (KR) .......... 10-2018-0082066

(51) Int. Cl.
*H01J 37/32*  (2006.01)
*H01L 21/02*  (2006.01)

(52) U.S. Cl.
CPC .... *H01J 37/3244* (2013.01); *H01J 37/32715* (2013.01); *H01L 21/02274* (2013.01);
(Continued)

(58) Field of Classification Search
CPC ............ H01J 37/3244; H01J 37/32715; H01J 2237/20214; H01J 2237/332;
(Continued)

(56) References Cited

U.S. PATENT DOCUMENTS 9,748,077 B2 * 8/2017 Han .................... C23C 16/4584
2003/0070617 A1  4/2003 Kim et al.
(Continued)

FOREIGN PATENT DOCUMENTS

JP  2011074413 A  4/2011
KR  20030002776 A  1/2003
(Continued)

*Primary Examiner* — Edward Chin
(74) *Attorney, Agent, or Firm* — Renaissance IP Law Group LLP

(57) ABSTRACT

The present inventive concept relates to a gas distribution apparatus of a substrate processing apparatus including: a first gas distribution module distributing a processing gas to a first gas distribution space; and a second gas distribution module distributing a processing gas to a second gas distribution space which differs from the first gas distribution space, a substrate processing apparatus, and a substrate processing method.

5 Claims, 13 Drawing Sheets

(52) U.S. Cl.
CPC .............. *H01J 2237/20214* (2013.01); *H01J 2237/332* (2013.01)

(58) Field of Classification Search
CPC ......... H01L 21/02274; H01L 21/68764; H01L 21/68771; H01L 21/67017; H01L 21/02046; H01L 21/02263
See application file for complete search history.

(56) References Cited

U.S. PATENT DOCUMENTS

| | | | |
|---|---|---|---|
| 2005/0233093 A1 | 10/2005 | Tada et al. | |
| 2009/0191722 A1 | 7/2009 | Hasebe et al. | |
| 2015/0110959 A1 | 4/2015 | Ashizawa et al. | |
| 2015/0111391 A1* | 4/2015 | Hwang | C23C 16/45544 438/758 |
| 2015/0225848 A1* | 8/2015 | Han | C23C 16/50 118/728 |
| 2018/0269078 A1* | 9/2018 | Cheon | C23C 16/509 |
| 2022/0074049 A1* | 3/2022 | Oh | H01L 21/67069 |

FOREIGN PATENT DOCUMENTS

| | | | | |
|---|---|---|---|---|
| KR | 20100127741 A | 12/2010 | | |
| KR | 20110138820 A | 12/2011 | | |
| KR | 20120081772 A | 7/2012 | | |
| KR | 20130074414 A | 7/2013 | | |
| KR | 20130118603 A | 10/2013 | | |
| WO | WO-2013115590 A1 * | 8/2013 | ........... | C23C 16/455 |
| WO | WO-2014003434 A1 * | 1/2014 | ....... | C23C 16/45536 |

* cited by examiner

APPARATUS FOR DISTRIBUTING GAS, AND APPARATUS AND METHOD FOR PROCESSING SUBSTRATE

TECHNICAL FIELD

The present disclosure relates to a substrate processing apparatus which performs a substrate processing process such as a deposition process of depositing a thin film on a substrate.

BACKGROUND ART

Generally, a thin-film layer, a thin-film circuit pattern, or an optical pattern should be formed on a substrate for manufacturing a solar cell, a semiconductor device, a flat panel display device, etc. To this end, a semiconductor manufacturing process is performed, and examples of the semiconductor manufacturing process include a thin film deposition process of depositing a thin film including a specific material on a substrate, a photo process of selectively exposing a portion of a thin film by using a photosensitive material, an etching process of removing the selectively exposed portion of the thin film to form a pattern, etc.

FIG. 1 is a conceptual side view of a related art substrate processing apparatus.

Referring to FIG. 1, a related art substrate processing apparatus 10 includes a substrate supporting unit 11 and a gas distribution unit 12.

The substrate supporting unit 11 supports a substrate S. The substrate supporting unit 11 rotates about a rotational shaft 11a to rotate the substrate S with respect to the rotational shaft 11a.

The gas distribution unit 12 distributes a process gas toward the substrate supporting unit 11. The gas distribution unit 12 distributes the process gas toward the substrate S supported by the substrate supporting unit 11, thereby performing a processing process of depositing a thin film on the substrate S.

Here, in the related art substrate processing apparatus 10, a centrifugal force based on the rotation of the substrate supporting unit 11 acts on the process gas distributed by the gas distribution unit 12. Therefore, the thin film is relatively thinly deposited in an inner portion of the substrate S. The inner portion of the substrate S is a portion which is disposed in a direction from the substrate S to the rotational shaft 11a of the substrate supporting unit 11.

For this reason, in the related art substrate processing apparatus 10, since the thin film is relatively thinly deposited in an inner portion of the substrate S, the uniformity of the thin film deposited on the substrate S is reduced, causing the degradation in quality of the substrate which has undergone the processing process.

DISCLOSURE

Technical Problem

The present inventive concept is devised to solve the above-described problems and is for providing a gas distribution apparatus for substrate processing apparatuses, a substrate processing apparatus, and a substrate processing method, which can decrease a degree to which a thin film is relatively thinly deposited in an inner portion of a substrate.

Technical Solution

To accomplish the above-described objects, the present inventive concept may include below-described elements.

A gas distribution apparatus of a substrate processing apparatus according to the present inventive concept may include: a first gas distribution module distributing a first gas to a first gas distribution space; a second gas distribution module distributing a processing gas to a second gas distribution space which differs from the first gas distribution space; and a third gas distribution module distributing a second gas to a third gas distribution space which differs from each of the first gas distribution space and the second gas distribution space. When the first gas distribution module distributes the first gas, the second gas distribution module may distribute the first gas to the second gas distribution space, and when the third gas distribution module distributes the second gas, the second gas distribution module may distribute the second gas to the second gas distribution space.

A gas distribution apparatus of a substrate processing apparatus according to the present inventive concept may include: a first gas distribution module distributing a processing gas to a first gas distribution space; a second gas distribution module distributing a processing gas to a second gas distribution space which differs from the first gas distribution space. When the first gas distribution module distributes the processing gas to the first gas distribution space, the second gas distribution module may distribute a processing gas, which is the same as the processing gas distributed by the first gas distribution module, to the second gas distribution space.

A substrate processing apparatus according to the present inventive concept may include: a process chamber; a substrate supporting unit installed in the process chamber to support a plurality of substrates, the substrate supporting unit rotating about a rotational shaft; a chamber lid covering an upper portion of the process chamber; and a gas distribution unit installed in the chamber lid to distribute a processing gas to the substrate supporting unit. The gas distribution unit may include a first gas distribution module installed in the chamber lid to distribute a source gas, a second gas distribution module installed in the chamber lid at a position spaced apart from the first gas distribution module, and a third gas distribution module installed in the chamber lid at a position spaced apart from each of the first gas distribution module and the second gas distribution module to distribute a reactant gas. When the first gas distribution module distributes the source gas, the second gas distribution module may distribute the source gas, and when the third gas distribution module distributes the reactant gas, the second gas distribution module may distribute the reactant gas.

A substrate processing apparatus according to the present inventive concept may include: a process chamber; a substrate supporting unit installed in the process chamber to support a plurality of substrates, the substrate supporting unit rotating about a rotational shaft; a chamber lid covering an upper portion of the process chamber; and a gas distribution unit installed in the chamber lid to distribute a processing gas to the substrate supporting unit. The gas distribution unit may include a first gas distribution module installed in the chamber lid to distribute a source gas and a second gas distribution module installed in the chamber lid at a position spaced apart from the first gas distribution module. When the first gas distribution module distributes a processing gas, the second gas distribution module may distribute a processing gas which is the same as the processing gas distributed by the first gas distribution module.

A substrate processing method according to the present inventive concept, a method of processing a substrate by distributing a processing gas to the inside of a process chamber, may include: distributing a source gas to a first gas distribution space and a second gas distribution space, which is adjacent to the first gas distribution space, of the process chamber; purging the source gas; distributing a reactant gas to the second gas distribution space and a third gas distribution space which differ from the first gas distribution space; and purging the reactant gas.

A substrate processing method according to the present inventive concept, a method of processing a substrate by distributing a processing gas to the inside of a process chamber, may include: distributing a source gas to a first gas distribution space and a second gas distribution space, which is adjacent to the first gas distribution space, of the process chamber; distributing a purge gas to the first gas distribution space and the second gas distribution space; and distributing a reactant gas to the first gas distribution space and the second gas distribution space.

A substrate processing method according to the present inventive concept, a method of processing a substrate by distributing a processing gas to the inside of a process chamber, may include: a time division processing process of processing the substrate in a time division mode of changing and distributing the processing gas in the process chamber with time; and a space division processing process of processing the substrate in a space division mode of distributing different processing gases to spaces of the process chamber.

Advantageous Effect

According to the present inventive concept, the following effects can be obtained.

The present inventive concept is implemented to enhance the uniformity of a thin film deposited on a substrate, thereby enhancing the quality of the substrate which has undergone a processing process.

The present inventive concept can decrease particles which occur because different process gases are mixed in the processing process performed on the substrate and a process of exhausting the process gases, thereby enhancing the stability of the processing process.

MODE FOR INVENTION

Hereinafter, embodiments of a substrate processing apparatus according to the present inventive concept will be described in detail with reference to the accompanying drawings. A gas distribution apparatus for substrate processing apparatuses according to the present inventive concept may be included in a substrate processing apparatus according to the present inventive concept, and thus, will be described together while describing embodiments of the substrate processing apparatus according to the present inventive concept.

Figure 1:
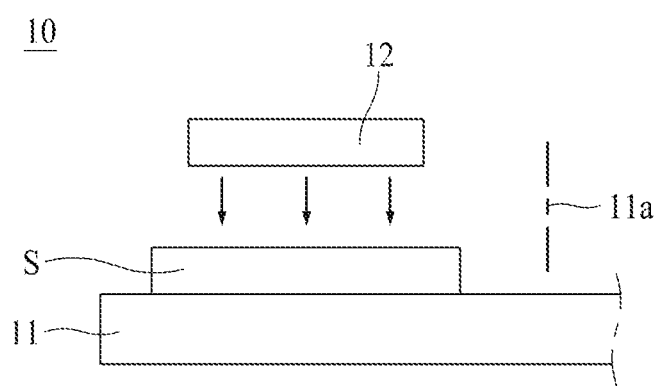
FIG. 1 is a conceptual side view of a related art substrate processing apparatus.
Figure 2:
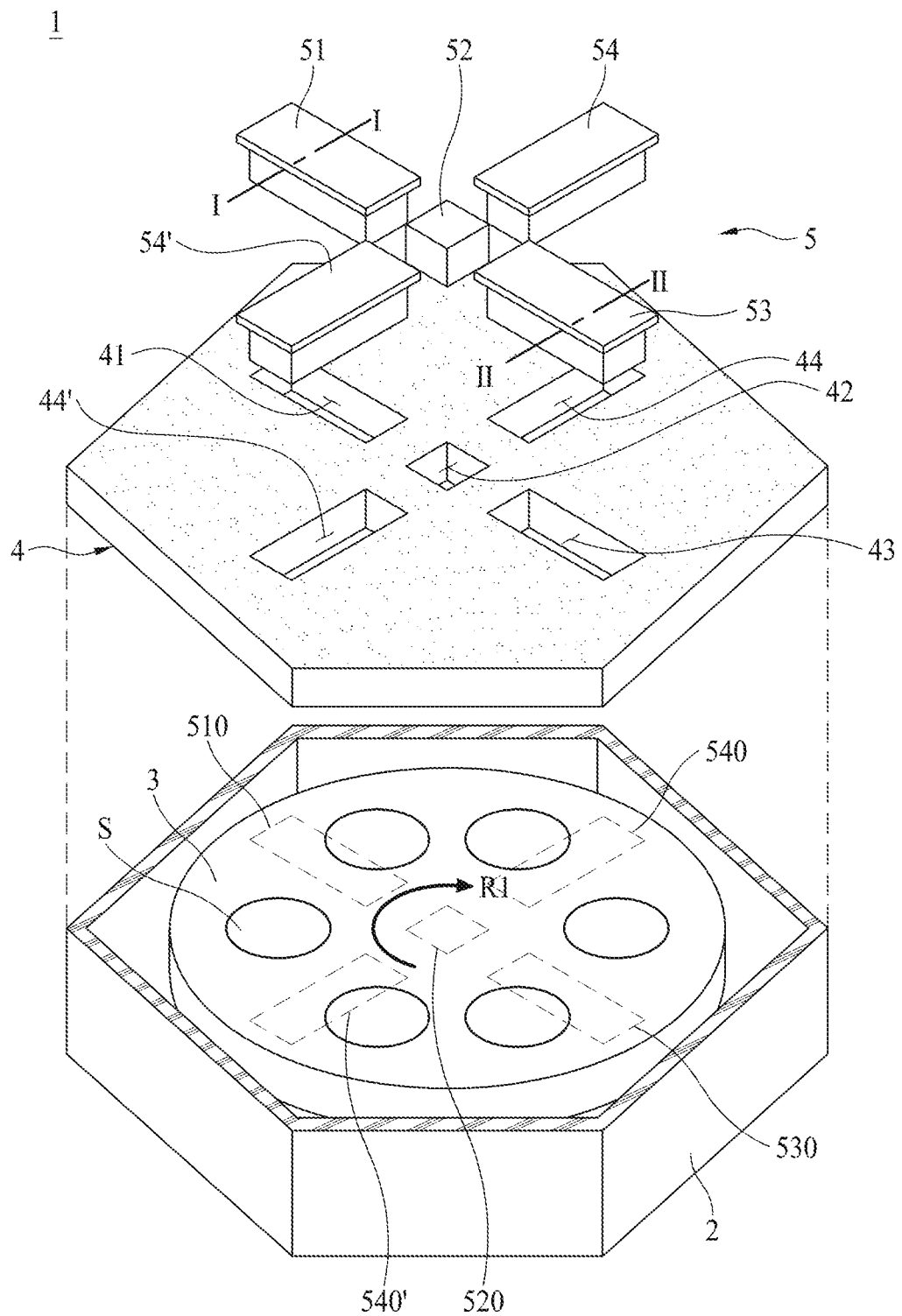
FIG. 2 is a schematically exploded perspective view of a substrate processing apparatus according to the present inventive concept.

Referring to FIG. 2, a substrate processing apparatus 1 according to the present inventive concept performs a processing process on a substrate S. For example, the substrate processing apparatus 1 according to the present inventive concept may perform a deposition process of depositing a thin film on the substrate S. The substrate processing apparatus 1 according to the present inventive concept includes a process chamber 2, a substrate supporting unit 3 installed in the process chamber 2, a chamber lid 4 that covers an upper portion of the process chamber 2, and a gas distribution unit 5 that is installed in the chamber lid 4 to distribute a process gas.

Referring to FIG. 2, the process chamber 2 provides a process space where the processing process is performed. The substrate supporting unit 3 and the chamber lid 4 may be installed in the process chamber 2. An exhaust unit for exhausting a gas and/or the like remaining in the process space may be installed in the process chamber 2.

Figure 3:
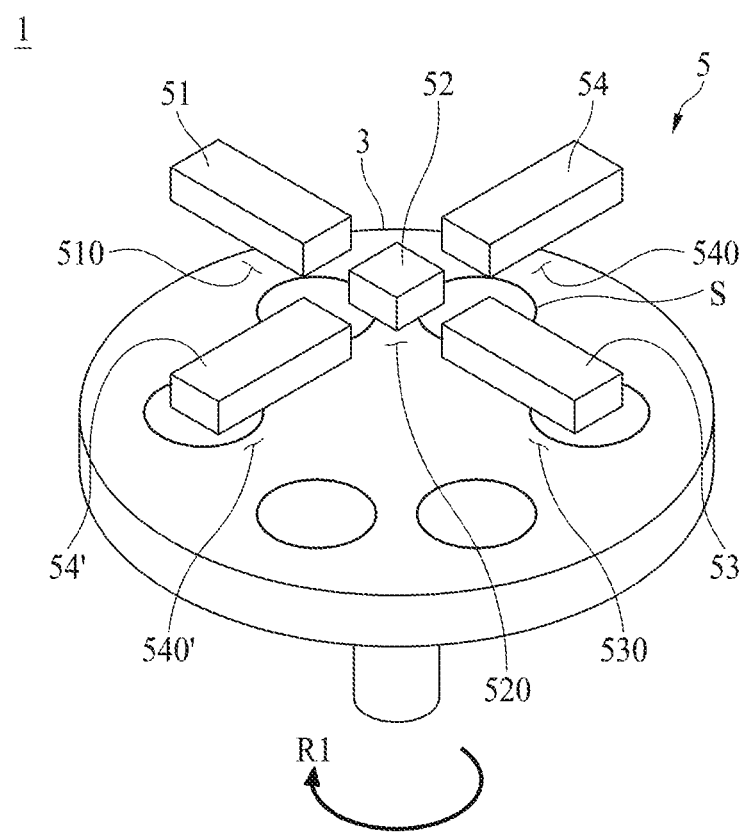
FIG. 3 is a conceptual perspective view of a substrate processing apparatus according to the present inventive concept.
Figure 4:
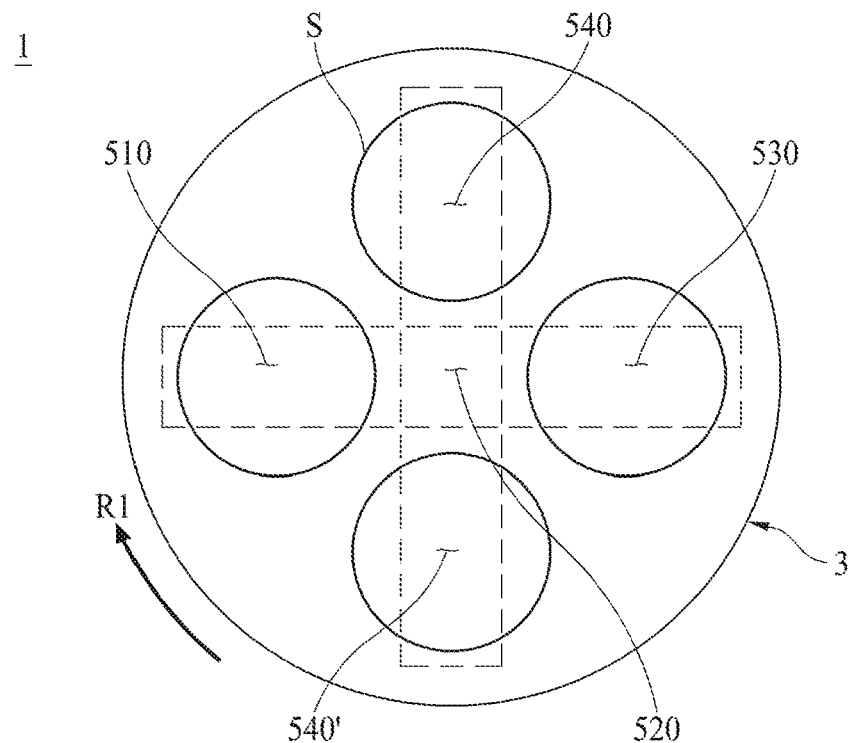
FIG. 4 is a conceptual plan view of a substrate processing apparatus according to the present inventive concept.

Referring to FIGS. 2 and 3, the substrate supporting unit 3 supports a plurality of substrates S. The substrates S are transported by a loading apparatus (not shown) installed outside the process chamber 2. The substrates S may be semiconductor substrates or wafers.

The substrate supporting unit 3 may be installed in the process chamber 2 so as to be located inside the process chamber 2. The substrate supporting unit 3 may be rotatably installed in the process chamber 2. The substrate supporting unit 3 may rotate in a first rotational direction (an R1 arrow direction). The first rotational direction (the R1 arrow direction) may be a clockwise and counterclockwise direction with respect to a rotational shaft of the substrate supporting unit 3. In this case, the substrates S may be supported by the substrate supporting unit 3 so as to be spaced apart from one another and arranged at the same angle along the first rotational direction (the R1 arrow direction) with respect to the rotational shaft of the substrate supporting unit 3.

Referring to FIGS. 2 and 3, the chamber lid 4 is installed in the process chamber 2 to cover the upper portion of the process chamber 2. Therefore, the chamber lid 4 may seal the process space. The chamber lid 4 and the process chamber 2, as illustrated in FIG. 2, may be provided in a hexagonal structure, or may be provided in a cylindrical structure, an elliptical structure, a polygonal structure, or the like without being limited thereto.

Referring to FIGS. 2 to 5, the gas distribution unit 5 distributes a process gas. The gas distribution unit 5 may be implemented as a gas distribution apparatus for substrate process apparatuses according to the present inventive concept. The gas distribution unit 5 may be installed in the chamber lid 4 to distribute the process gas toward the substrate supporting unit 3. Therefore, the gas distribution unit 5 may distribute the process gas toward the substrates S supported by the substrate supporting unit 3. The gas distribution unit 5 may be installed in the chamber lid 4 and may be disposed on the substrate supporting unit 3.

The gas distribution unit 5 may include a first gas distribution module 51, a second gas distribution module 52, and a third gas distribution module 53. Hereinafter, the first gas distribution module 51, the second gas distribution module 52, and the third gas distribution module 53 will be described in order. The terms "first", "second", and "third" are differentiating one element from another element, and the right scope should not be limited to the terms.

The first gas distribution module 51 distributes a first gas of process gases. The first gas may be a source gas. The first gas distribution module 51 is installed in the chamber lid 4. A first installation hole 41 (illustrated in FIG. 2) where the first gas distribution module 51 is installed may be provided in the chamber lid 4. The first gas distribution module 51 may be inserted into the first installation hole 41, and thus, may be installed in the chamber lid 4. The first installation hole 41 may be provided to pass through the chamber lid 4.

The first gas distribution module 51 may be installed in the chamber lid 4 to distribute the first gas toward the substrate supporting unit 3. The first gas distribution module 51 may be installed in the chamber lid 4 and may be disposed on the substrate supporting unit 3. When the substrate supporting unit 3 rotates about the rotational shaft, the substrates S supported by the substrate supporting unit 3 may sequentially pass through a lower portion of the first gas distribution module 51.

The first gas distribution module 51 may distribute the first gas to a first gas distribution space 510. In this case, the substrate supporting unit 3 may rotate in the first rotational direction (the R1 arrow direction), and thus, the substrates S supported by the substrate supporting unit 3 may pass through the first gas distribution space 510. Therefore, the first gas distribution module 51 may distribute the first gas toward the substrate S disposed in the first gas distribution space 510. The first gas distribution space 510 may be disposed between the first gas distribution module 51 and the substrate supporting unit 3.

When the first gas distribution module 51 distributes the first gas to the first gas distribution space 510, the first gas may be diffused to an outer portion of the first gas distribution space 510 via the first gas distribution space 510. Therefore, due to the first gas distributed by the first gas distribution module 51, the whole process space may be filled with the first gas. Therefore, the first gas distribution module 51 may be implemented so that, by distributing the first gas to the first gas distribution space 510, a processing process using the first gas is performed on all of the substrates S supported by the substrate supporting unit 3. Therefore, the first gas distribution module 51 may be implemented to intensively perform the processing process using the first gas on the substrate S disposed in the first gas distribution space 510 and to perform the processing process using the first gas on the substrates S disposed outside the first gas distribution space 510. Accordingly, the substrate processing apparatus 1 according to the present inventive concept may shorten a time taken in the processing process using the first gas.

Figure 5:
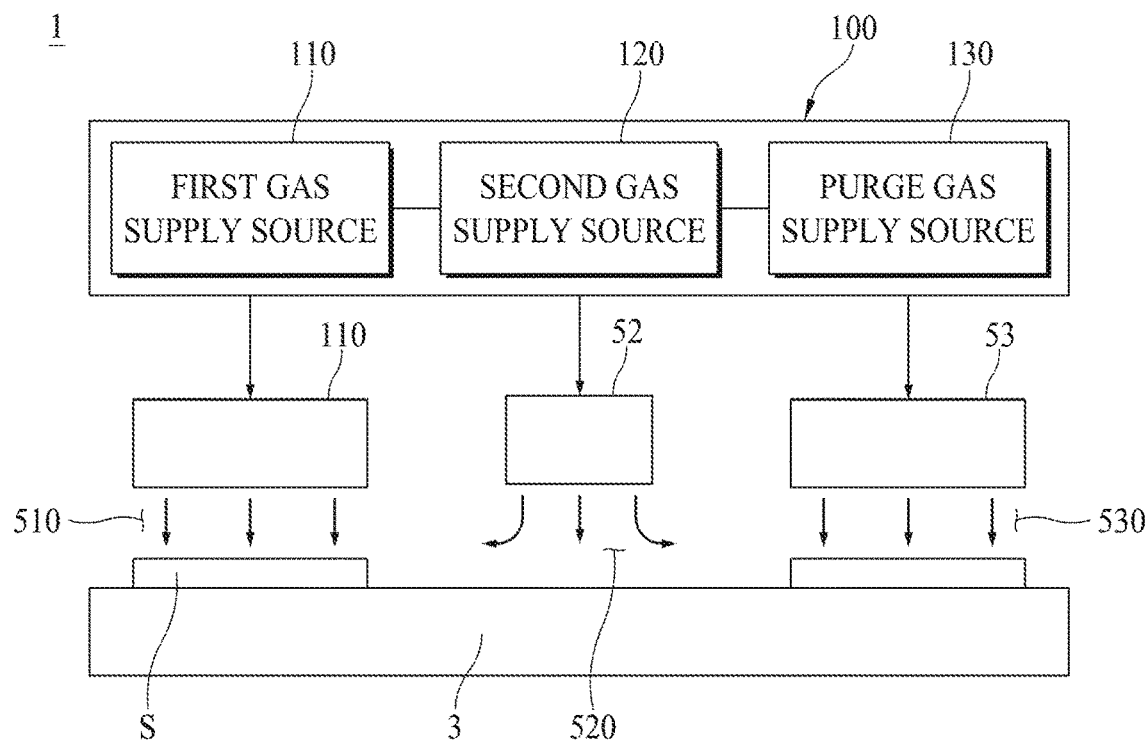
FIG. 5 is a conceptual side view of a substrate processing apparatus according to the present inventive concept.

The first gas distribution module 51 may be connected to a gas supply unit 100 (illustrated in FIG. 5). The gas supply unit 100 supplies the process gas to the gas distribution unit 5. The gas supply unit 100 may include a first gas supply source 110 (illustrated in FIG. 5) which supplies the first gas. The first gas distribution module 51 may be supplied with the first gas from the first gas supply source 110 and may supply the supplied first gas to the first gas distribution space 510. The first gas distribution module 51 may be connected to the first gas supply source 110 through a pipe, a tube, or the like.

The third gas distribution module 53 distributes a second gas of the process gases. The second gas, a process gas which differs from the first gas, may be a reactant gas. The third gas distribution module 53 is installed in the chamber lid 4. The third gas distribution module 53 is installed in the chamber lid 4 at a position spaced apart from the first gas distribution module 51. A third installation hole 43 (illustrated in FIG. 2) where the third gas distribution module 53 is installed may be provided in the chamber lid 4. The third gas distribution module 53 may be inserted into the third installation hole 43, and thus, may be installed in the chamber lid 4. The third installation hole 43 may be provided to pass through the chamber lid 4.

The third gas distribution module 53 may be installed in the chamber lid 4 to distribute the second gas toward the substrate supporting unit 3. The third gas distribution module 53 may be installed in the chamber lid 4 and may be disposed on the substrate supporting unit 3. When the substrate supporting unit 3 rotates about the rotational shaft, the substrates S supported by the substrate supporting unit 3 may sequentially pass through a lower portion of the third gas distribution module 53 and a lower portion of the first gas distribution module 51.

The third gas distribution module 53 may distribute the second gas to a third gas distribution space 530. The third gas distribution space 530 differs from the first gas distribution space 510. The third gas distribution space 530 and the first gas distribution space 510 may be disposed at positions spaced apart from each other by a separation distance between the third gas distribution module 53 and the first gas distribution module 51. In this case, the substrate supporting unit 3 may rotate in the first rotational direction (the R1 arrow direction), and thus, the substrates S supported by the substrate supporting unit 3 may pass through the third gas distribution space 530. Therefore, the third gas distribution module 53 may distribute the second gas toward the substrate S disposed in the third gas distribution space 530. The third gas distribution space 530 may be disposed between the third gas distribution module 53 and the substrate supporting unit 3.

When the third gas distribution module 53 distributes the second gas to the third gas distribution space 530, the second gas may be diffused to an outer portion of the third gas distribution space 530 via the third gas distribution space 530. Therefore, due to the second gas distributed by the third gas distribution module 53, the whole process space may be filled with the second gas. Therefore, the third gas distribution module 53 may be implemented so that, by distributing the second gas to the third gas distribution space 530, a processing process using the second gas is performed on all of the substrates S supported by the substrate supporting unit 3. Therefore, the third gas distribution module 53 may be implemented to intensively perform the processing process using the second gas on the substrate S disposed in the third gas distribution space 530 and to perform the processing process using the second gas on the substrates S disposed outside the third gas distribution space 530. Accordingly, the substrate processing apparatus 1 according to the present inventive concept may shorten a time taken in the processing process using the second gas.

When the third gas distribution module 53 distributes the second gas, the first gas distribution module 51 may stop the distribution of the first gas. When the first gas distribution module 51 distributes the first gas, the third gas distribution module 53 may stop the distribution of the second gas. Therefore, the substrate processing apparatus 1 according to the present inventive concept can decrease particles which occur because the first gas and the second gas are mixed in the processing process and a process of exhausting the process gas. Also, the substrate processing apparatus 1 according to the present inventive concept can prevent the quality of the substrate S undergoing the processing process from being degraded due to mixing of the first gas and the second gas.

The third gas distribution module 53 may be connected to the gas supply unit 100. The gas supply unit 100 may include a second gas supply source 120 (illustrated in FIG. 5) which supplies the second gas. The third gas distribution module 53 may be supplied with the second gas from the second gas supply source 120 and may supply the supplied second gas to the third gas distribution space 530. The third gas distribution module 53 may be connected to the second gas supply source 120 through a pipe, a tube, or the like.

The second gas distribution module 52 distributes the process gas. When the gas distribution unit 5 includes the first gas distribution module 51 and the third gas distribution module 53, the second gas distribution module 52 may selectively distribute one of the first gas and the second gas. When the first gas distribution module 51 distributes the first gas, the second gas distribution module 52 may distribute the first gas. Therefore, the substrate processing apparatus 1 according to the present inventive concept may increase an area, to which the first gas is distributed, of the process space to enhance the processing efficiency of the processing process using the first gas. When the third gas distribution module 53 distributes the second gas, the second gas distribution module 52 may distribute the second gas. Therefore, the substrate processing apparatus 1 according to the present inventive concept may increase an area, to which the second gas is distributed, of the process space to enhance the processing efficiency of the processing process using the second gas.

The second gas distribution module 52 is installed in the chamber lid 4. The second gas distribution module 52 is installed in the chamber lid 4 at a position spaced apart from the first gas distribution module 51 and the third gas distribution module 53. A second installation hole 42 (illustrated in FIG. 2) where the second gas distribution module 52 is installed may be provided in the chamber lid 4. The second gas distribution module 52 may be inserted into the second installation hole 42, and thus, may be installed in the chamber lid 4. The second installation hole 42 may be provided to pass through the chamber lid 4.

The second gas distribution module 52 may distribute the process gas to a second gas distribution space 520. The second gas distribution space 520 differs from each of the first gas distribution space 510 and the third gas distribution space 530. The second gas distribution space 520 may be disposed at a position spaced apart from each of the first gas distribution space 510 and the third gas distribution space 530 by a separation distance between the second gas distribution module 52 and each of the first gas distribution module 51 and the third gas distribution module 53. The second gas distribution space 520 may be disposed adjacent to the first gas distribution space 510. The second gas distribution space 520 may be disposed adjacent to the third gas distribution space 530. The third gas distribution space 530 may differ from each of the first gas distribution space 510 and the second gas distribution space 520. The second gas distribution space 520 may be disposed between the first gas distribution space 510 and the third gas distribution space 530.

The second gas distribution module 52 may be installed in the chamber lid 4 to distribute the process gas toward the substrate supporting unit 3. The second gas distribution module 52 may be installed in the chamber lid 4 and may be disposed on the substrate supporting unit 3. The second gas distribution module 52 may be disposed between the second gas distribution module 52 and the substrate supporting unit 3.

The second gas distribution module 52 may be installed in the chamber lid 4 not to overlap a rotational path of the substrates S. The rotational path of the substrates S denotes a path through which the substrates S move according to the substrate supporting unit 3 rotating about the rotational shaft. Since the second gas distribution module 52 is disposed not to overlap the rotational path of the substrates S, the substrates S move along the rotational path and do not pass through a lower portion of the second gas distribution module 52. In this case, the first gas distribution module 51 and the third gas distribution module 53 may be installed in the chamber lid 4 to overlap the rotational path of the substrates S. Therefore, the substrates S move along the rotational path and pass through a lower portion of the first gas distribution module 51 and a lower portion of the third gas distribution module 53.

The second gas distribution module 52 may be installed in the chamber lid 4 and may be disposed at a position upwardly spaced apart from a center, where the substrates are not placed, of the substrate supporting unit 3. In this case, the first gas distribution module 51 and the third gas distribution module 53 may be installed in the chamber lid 4 and may be disposed at a position upwardly spaced apart from an outer portion of the center of the substrate supporting unit 3.

The second gas distribution module 52 may be installed in the chamber lid 4 and may be disposed at a position upwardly spaced apart from the rotational shaft of the substrate supporting unit 3. The second gas distribution space 520 may be disposed between the second gas distribution module 52 and the substrate supporting unit 3. When the second gas distribution module 52 distributes the process gas to the second gas distribution space 520, the process gas may be diffused to an outer portion of the second gas distribution space 520 via the second gas distribution space 520.

When the second gas distribution module 52 distributes the first gas to the second gas distribution space 520, the first gas may be diffused to the first gas distribution space 510. In this case, the first gas distributed by the second gas distribution module 52 may be supplied to an inner portion of the substrate S placed in the first gas distribution space 510. The inner portion of the substrate S is a portion is disposed in a direction from the substrate S to the rotational shaft of the substrate supporting unit 3. Therefore, in comparison with a comparative example where the first gas is distributed to the first gas distribution space 510 by using only the first gas distribution module 51, the substrate processing apparatus 1 according to the present inventive concept may increase a flow rate of the first gas supplied to the inner portion of the substrate S. Accordingly, in comparison with a comparative example where a thin film is relatively thinly deposited in the inner portion of the substrate S, the substrate processing apparatus 1 according to the present inventive concept may increase a thickness of the thin film deposited in the inner portion of the substrate S, thereby enhancing the uniformity of the thin film deposited on the substrate S.

When the second gas distribution module 52 distributes the second gas to the second gas distribution space 520, the second gas may be diffused to the third gas distribution space 530. In this case, the second gas distributed by the second gas distribution module 52 may be supplied to an inner portion of the substrate S placed in the third gas distribution space 530. Therefore, in comparison with a comparative example where the second gas is distributed to the third gas distribution space 530 by using only the third gas distribution module 53, the substrate processing apparatus 1 according to the present inventive concept may increase a flow rate of the second gas supplied to the inner portion of the substrate S. Accordingly, in comparison with a comparative example where a thin film is relatively thinly deposited in the inner portion of the substrate S, the substrate processing apparatus 1 according to the present inventive concept may increase a thickness of the thin film deposited in the inner portion of the substrate S, thereby enhancing the uniformity of the thin film deposited on the substrate S.

A process gas distributed by the second gas distribution module 52 may be diffused to a whole process space which includes the first gas distribution space 510 and the third gas distribution space 530. Therefore, the second gas distribution module 52 may help the whole process space to be filled with the process gas. Accordingly, the second gas distribution module 52 may be implemented so that, by distributing the process gas to the second gas distribution space 520, a processing process using the process gas is performed on all of the substrates S supported by the substrate supporting unit 3.

When the first gas distribution module 51 distributes the first gas, the second gas distribution module 52 may stop the distribution of the second gas and may distribute the first gas. When the third gas distribution module 53 distributes the second gas, the second gas distribution module 52 may stop the distribution of the first gas and may distribute the second gas. Therefore, the substrate processing apparatus 1 according to the present inventive concept can decrease particles which occur because the first gas and the second gas are mixed in the processing process and a process of exhausting the process gas. Also, the substrate processing apparatus 1 according to the present inventive concept can prevent the quality of the substrate S undergoing the processing process from being degraded due to mixing of the first gas and the second gas.

The second gas distribution module 52 may be connected to the gas supply unit 100. The gas supply unit 100 may be connected to each of the first gas supply source 110 and the second gas supply source 120. The second gas distribution module 52 may be supplied with the first gas from the first gas supply source 110 and may supply the supplied first gas to the second gas distribution space 520. The second gas distribution module 52 may be supplied with the second gas from the second gas supply source 120 and may supply the supplied second gas to the second gas distribution space 520. The second gas distribution module 52 may be connected to each of the first gas supply source 110 and the second gas supply source 120 through a pipe, a tube, or the like.

The second gas distribution module 52 may be installed in the chamber lid 4 and may be disposed between the first gas distribution module 51 and the third gas distribution module 53. In this case, the first gas distribution module 51 may be installed in the chamber lid 4 and may be disposed at a position spaced apart from the second gas distribution module 52 to one side. The third gas distribution module 53 may be installed in the chamber lid 4 and may be disposed at a position spaced apart from the second gas distribution module 52 to another side. Therefore, the substrate processing apparatus 1 according to the present inventive concept may be implemented so that a process gas distributed by the second gas distribution module 53 is supplied to each of the first gas distribution space 510 and the third gas distribution space 530. The second gas distribution module 52, the first gas distribution module 51, and the third gas distribution module 53 may be installed in the chamber lid 4 and may be disposed on the same line.

The second gas distribution module 52 may be installed in the chamber lid 4 and may be disposed at a position spaced apart from each of the substrate S placed in the first gas distribution space 510 and the substrate S placed in the third gas distribution space 530. In this case, the second gas distribution module 52 may be implemented so as not to directly distribute a process gas to each of the substrate S placed in the first gas distribution space 510 and the substrate S placed in the third gas distribution space 530. Accordingly, the substrate processing apparatus 1 according to the present inventive concept prevents a thin film from being deposited to an excessive thickness in each of an inner portion of the substrate S placed in the first gas distribution space 510 and an inner portion of the substrate S placed in the third gas distribution space 530, thereby enhancing the uniformity of the thin film deposited on each of the substrates S.

Figure 6:
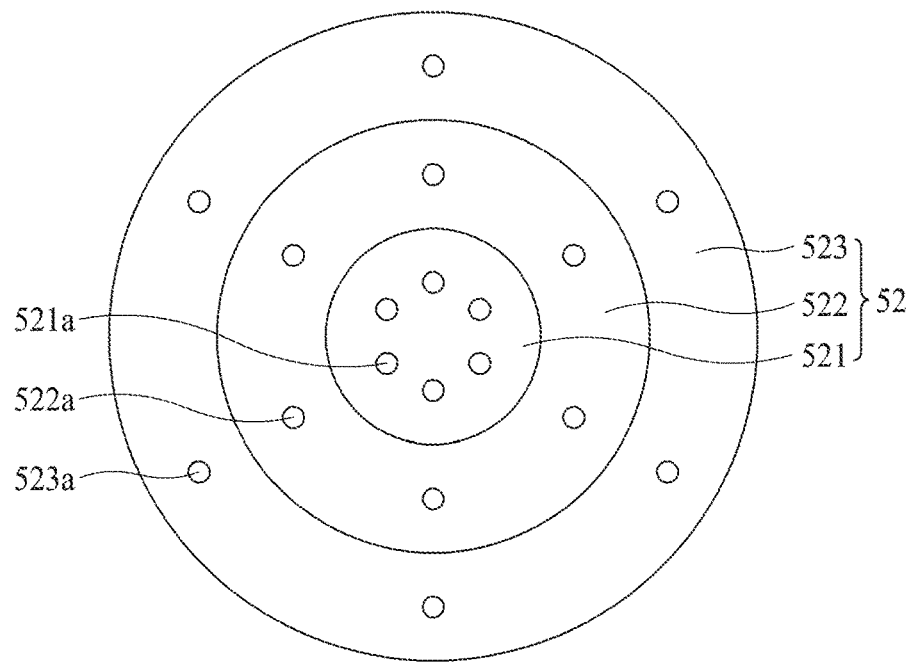
FIG. 6 is a schematic plan view of a second gas distribution module in a substrate processing apparatus according to the present inventive concept.

Referring to FIGS. 2 to 6, the second gas distribution module 52 may include a first gas distribution member 521 (illustrated in FIG. 6) and a second gas distribution member 522 (illustrated in FIG. 6).

The first gas distribution member 521 is for distributing the first gas. The first gas distribution member 521 may be connected to the first gas supply source 110. The first gas distribution member 521 may be supplied with the first gas from the first gas supply source 110 and may distribute the supplied first gas to the second gas distribution space 520. A plurality of first gas distribution holes 521a (illustrated in FIG. 6) may be provided in the first gas distribution member 521. The first gas distribution member 521 may distribute the first gas to the second gas distribution space 520 by using the first gas distribution holes 521a. The first gas distribution holes 521a may be spaced apart from one another and arranged at the same interval. In FIG. 6, six first gas distribution holes 521a are illustrated as being provided in the first gas distribution member 521, but without being limited thereto, two to five or seven or more first gas distribution holes 521a may be provided in the first gas distribution member 521. The first gas distribution member 521 may be provided in a disc shape, but without being limited thereto, the first gas distribution member 521 may be provided in another shape such as a tetragonal plate shape which enables the first gas to be distributed to the second gas distribution space 520.

The second gas distribution member 522 is for distributing the second gas. The second gas distribution member 522 may be connected to the second gas supply source 120. The second gas distribution member 522 may be supplied with the second gas from the second gas supply source 120 and may distribute the supplied second gas to the second gas distribution space 520. A plurality of second gas distribution holes 522a (illustrated in FIG. 6) may be provided in the second gas distribution member 522. The second gas distribution member 522 may distribute the second gas to the second gas distribution space 520 by using the second gas distribution holes 522a. The second gas distribution holes 522a may be spaced apart from one another and arranged at the same interval. In FIG. 6, six second gas distribution holes 522a are illustrated as being provided in the second gas distribution member 522, but without being limited thereto, two to five or seven or more second gas distribution holes 522a may be provided in the second gas distribution member 522. The second gas distribution member 522 may be provided in a disc shape, but without being limited thereto, the second gas distribution member 522 may be provided in another shape such as a tetragonal plate shape which enables the second gas to be distributed to the second gas distribution space 520.

The second gas distribution member 522 and the first gas distribution member 521 may be disposed to distribute the process gas to different spaces in the second gas distribution space 520. For example, the first gas distribution member 521 may be disposed inward from the second gas distribution member 522. For example, the second gas distribution member 522 may be disposed inward from the first gas distribution member 521.

The second gas distribution module 52 may selectively distribute the second gas and the first gas to the second gas distribution space 520 through the second gas distribution member 522 and the first gas distribution member 521. When each of the first gas distribution module 51 and the first gas distribution member 521 distributes the first gas, the second gas distribution member 522 may stop the distribution of the second gas. When each of the third gas distribution module 53 and the second gas distribution member 522 distributes the second gas, the first gas distribution member 521 may stop the distribution of the first gas.

Therefore, the substrate processing apparatus 1 according to the present inventive concept may be implemented so that the first gas and the second gas are not mixed in the second gas distribution module 52. Accordingly, the substrate processing apparatus 1 according to the present inventive concept can decrease particles which occur because the first gas and the second gas are mixed in the processing process and a process of exhausting the process gas. Also, the substrate processing apparatus 1 according to the present inventive concept can prevent the quality of the substrate S undergoing the processing process from being degraded due to mixing of the first gas and the second gas.

The second gas distribution member 522 and the first gas distribution member 521 may selectively supply a process gas, based on whether each of the first gas distribution module 51 and the third gas distribution module 53 distributes a gas. When the first gas distribution module 51 distributes the first gas, the first gas distribution member 521 may distribute the first gas, and the second gas distribution member 522 may stop the distribution of the second gas. When the third gas distribution module 53 distributes the second gas, the second gas distribution member 522 may distribute the second gas, and the first gas distribution member 521 may stop the distribution of the first gas. The second gas distribution module 52 may include a valve and the like and may be implemented so that, by selectively opening or closing a flow path connected to each of the first gas distribution member 521 and the second gas distribution member 522, each of the first gas distribution member 521 and the second gas distribution member 522 selectively distributes a process gas.

Figure 7:
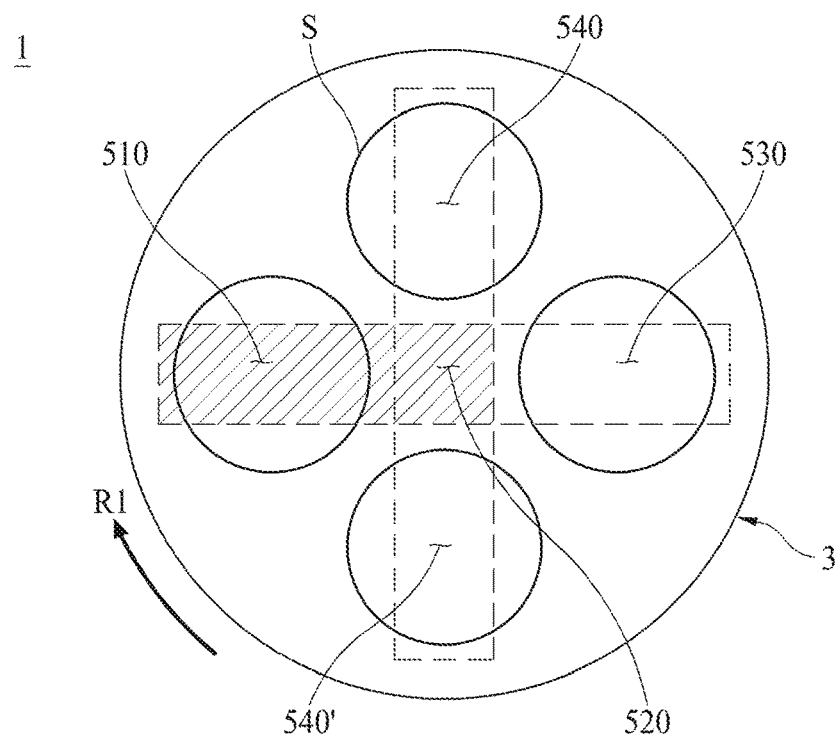
FIGS. 7 to 9 are conceptual plan views for describing an operation of a substrate processing apparatus according to the present inventive concept.
Figure 8:
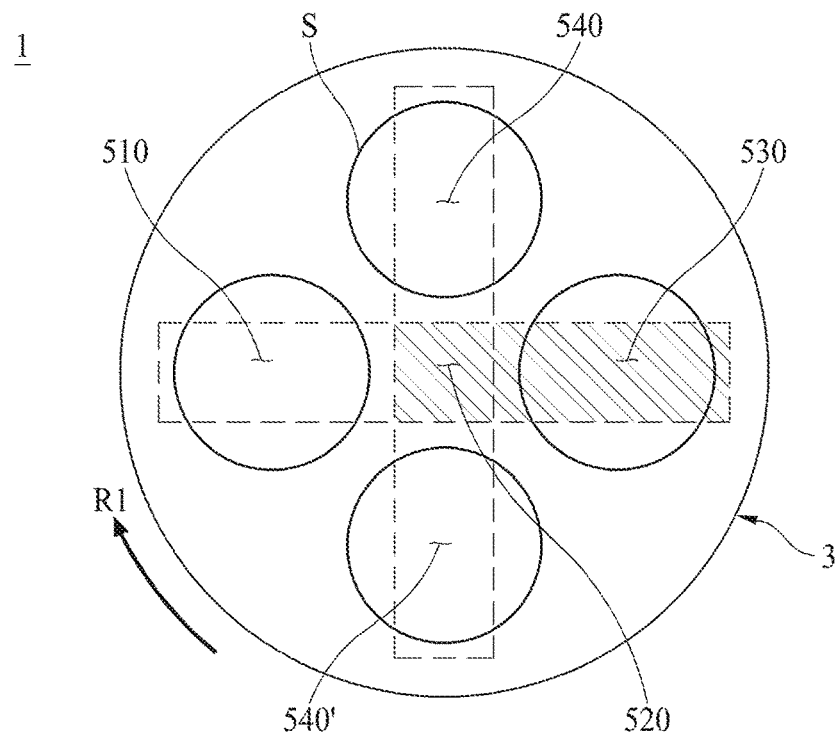

Referring to FIGS. 2 to 8, the substrate processing apparatus 1 according to the present inventive concept may operate as follows to perform the processing process. In FIGS. 7 and 8, a hatched portion is a space to which a process gas is directly distributed, and an unhatched portion is a space to which the process gas is not directly distributed. In FIGS. 7 and 8, four substrates S are illustrated as being supported by the substrate supporting unit 3, but without being limited thereto, two, three, or five or more substrates S may be supported by the substrate supporting unit 3.

As illustrated in FIG. 7, when the first gas is distributed to the first gas distribution space 510, the first gas may also be distributed to the second gas distribution space 520. In this case, the second gas is not distributed to the third gas distribution space 530. In the first gas distributed to the first gas distribution space 510 and the second gas distribution space 520, a higher amount of first gas is distributed in the substrate S placed in the first gas distribution space 510, but the first gas may be diffused to a whole process space including the third gas distribution space 530.

As illustrated in FIG. 8, when the second gas is distributed to the third gas distribution space 530, the second gas may also be distributed to the second gas distribution space 520. In this case, the first gas is not distributed to the first gas distribution space 510. In the second gas distributed to the third gas distribution space 530 and the second gas distribution space 520, a higher amount of second gas is distributed in the substrate S placed in the third gas distribution space 530, but the second gas may be diffused to a whole process space including the first gas distribution space 510.

Referring to FIGS. 2 to 5, the gas distribution unit 5 may include a purge gas distribution module 54.

The purge gas distribution module 54 distributes a purge gas. The purge gas is for purging a process gas placed in the process space. The process gas placed in the process space may be exhausted from the process chamber 2 due to the purge gas distributed by the purge gas distribution module 54. The purge gas distribution module 54 is installed in the chamber lid 4. The purge gas distribution module 54 is installed in the chamber lid 4 at a position spaced apart from each of the first gas distribution module 51, the third gas distribution module 53, and the second gas distribution module 52. A fourth installation hole 44 (illustrated in FIG. 2) where the purge gas distribution module 54 is installed may be provided in the chamber lid 4. The purge gas distribution module 54 may be inserted into the fourth installation hole 44, and thus, may be installed in the chamber lid 4. The fourth installation hole 44 may be provided to pass through the chamber lid 4.

The purge gas distribution module 54 may be installed in the chamber lid 4 to distribute the purge gas toward the substrate supporting unit 3. The purge gas distribution module 54 may be installed in the chamber lid 4 so as to be disposed on the substrate supporting unit 3. When the substrate supporting unit 3 rotates about the rotational shift, the substrates S supported by the substrate supporting unit 3 may sequentially pass through a portion under the purge gas distribution module 54, a portion under the first gas distribution module 51, and a portion under the third gas distribution module 51.

The purge gas distribution module 54 may distribute the purge gas to a purge gas distribution space 540. The purge gas distribution space 540, the second gas distribution space 520, the third gas distribution space 530, and the first gas distribution space 510 are different spaces. The purge gas distribution space 540, the second gas distribution space 520, the third gas distribution space 530, and the first gas distribution space 510 may be disposed at positions spaced apart from one another by a separation distance between the purge gas distribution module 54, the second gas distribution module 52, the third gas distribution module 53, and the first gas distribution module 51. In this case, the substrates S supported by the substrate supporting unit 3 may pass through the purge gas distribution space 540 according to the substrate supporting unit 3 rotating in the first rotational direction (the R1 arrow direction). Therefore, the purge gas distribution module 54 may distribute the purge gas toward the substrate S placed in the purge gas distribution space 540. The purge gas distribution space 540 may be disposed between the purge gas distribution module 54 and the substrate supporting unit 3.

When the purge gas distribution module 54 distributes the purge gas to the purge gas distribution space 540, the purge gas may be diffused to the outside of the purge gas distribution space 540 via the purge gas distribution space 540. Therefore, due to the purge gas distributed by the purge gas distribution module 54, the whole process space may be filled with the purge gas. Therefore, the purge gas distribution module 54 may be implemented so that, by distributing the purge gas to the purge gas distribution space 540, an exhaust process using the purge gas may be performed on all of the substrates S supported by the substrate supporting unit 3.

When the purge gas distribution module 54 distributes the purge gas, each of the first gas distribution module 51 and the third gas distribution module 53 may stop the distribution of a corresponding process gas. When the first gas distribution module 51 distributes the first gas, the purge gas distribution module 54 may stop the distribution of the purge gas. When the third gas distribution module 53 distributes the second gas, the purge gas distribution module 54 may stop the distribution of the purge gas.

The purge gas distribution module 54 may be connected to the gas supply unit 100. The gas supply unit 100 may include a purge gas supply source 130 (illustrated in FIG. 5) which supplies the purge gas. The purge gas distribution module 54 may be supplied with the purge gas from the purge gas supply source 130 and may supply the supplied purge gas to the purge gas distribution space 540. The purge gas distribution module 54 may be connected to the purge gas supply source 130 through a pipe, a tube, or the like.

In a case where the purge gas distribution module 54 is provided, when the purge gas distribution module 54 distributes the purge gas, the second gas distribution module 52 may distribute the purge gas. Therefore, the substrate processing apparatus 1 according to the present inventive concept may increase an area, to which the purge gas is distributed, of the process space to enhance the processing efficiency of the exhaust process using the purge gas.

In a case where the purge gas distribution module 54 is provided, the second gas distribution module 52 may include a purge gas distribution member 523 (illustrated in FIG. 6).

The purge gas distribution member 523 is for distributing the purge gas. The purge gas distribution member 523 may be connected to the purge gas supply source 130. The purge gas distribution member 523 may be supplied with the purge gas from the purge gas supply source 130 and may distribute the supplied purge gas to the second gas distribution space 520. A plurality of purge gas distribution holes 523a (illustrated in FIG. 6) may be provided in the purge gas distribution member 523. The purge gas distribution member 523 may distribute the purge gas to the second gas distribution space 520 by using the purge gas distribution holes 523a. The purge gas distribution holes 523a may be spaced apart from one another and arranged at the same interval. In FIG. 6, six purge gas distribution holes 523a are illustrated as being provided in the purge gas distribution member 523, but without being limited thereto, two to five or seven or more purge gas distribution holes 523a may be provided in the purge gas distribution member 523. The purge gas distribution member 523 may be provided in a disc shape, but without being limited thereto, the purge gas distribution member 523 may be provided in another shape such as a tetragonal plate shape which enables the purge gas to be distributed to the second gas distribution space 520.

The purge gas distribution member 523, the second gas distribution member 522, and the first gas distribution member 521 may be disposed to distribute a processing gas to different spaces in the second gas distribution space 520. The processing gas may include a purge gas and a process gas, and the process gas may include a first gas and a second gas. For example, the second gas distribution member 522 may be disposed inward from the purge gas distribution member 523, and the first gas distribution member 521 may be disposed inward from the second gas distribution member 522. For example, the first gas distribution member 521 may be disposed inward from the purge gas distribution member 523, and the second gas distribution member 522 may be disposed inward from the first gas distribution member 521. For example, the purge gas distribution member 523 may be disposed inward from the first gas distribution member 521 or the second gas distribution member 522.

The second gas distribution module 52 may distribute the processing gas to the second gas distribution space 520 through the purge gas distribution member 523, the second gas distribution member 522, and the first gas distribution member 521. In this case, the second gas distribution module 52 may selectively distribute the purge gas, the second gas, and the first gas to the second gas distribution space 520 through the purge gas distribution member 523, the second gas distribution member 522, and the first gas distribution member 521. When each of the first gas distribution module 51 and the first gas distribution member 521 distributes the first gas, the purge gas distribution member 523 may stop the distribution of the purge gas. At this time, the second gas distribution member 522 may stop the distribution of the second gas. When each of the third gas distribution module 53 and the second gas distribution member 522 distributes the second gas, the purge gas distribution member 523 may stop the distribution of the purge gas. At this time, the first gas distribution member 521 may stop the distribution of the first gas. When the purge gas distribution module 54 distributes the purge gas, the purge gas distribution member 523 may distribute the purge gas. At this time, the first gas distribution member 521 may stop the distribution of the first gas, and the second gas distribution member 522 may stop the distribution of the second gas.

The purge gas distribution member 523, the second gas distribution member 522, and the first gas distribution member 521 may selectively supply the process gas and the purge gas, based on whether each of the first gas distribution module 51, the third gas distribution module 53, and the purge gas distribution module 54 distributes a gas. When the first gas distribution module 51 distributes the first gas, the first gas distribution member 521 may distribute the first gas. At this time, the second gas distribution member 522 may stop the distribution of the second gas, and the purge gas distribution member 523 may stop the distribution of the purge gas. When the third gas distribution module 53 distributes the second gas, the second gas distribution member 522 may distribute the second gas. At this time, the first gas distribution member 521 may stop the distribution of the first gas, and the purge gas distribution member 523 may stop the distribution of the purge gas. When the purge gas distribution module 54 distributes the purge gas, the purge gas distribution member 523 may distribute the purge gas. At this time, the first gas distribution member 521 may stop the distribution of the first gas, and the second gas distribution member 522 may stop the distribution of the second gas. The second gas distribution module 52 may include a valve and the like and may be implemented so that, by selectively opening or closing a flow path connected to each of the first gas distribution member 521, the second gas distribution member 522, and the purge gas distribution member 523, each of the first gas distribution member 521, the second gas distribution member 522, and the purge gas distribution member 523 selectively distributes the process gas and the purge gas.

The purge gas distribution module 54, the third gas distribution module 53, and the first gas distribution module 51 may be installed in the chamber lid 4 so as to be spaced apart from one another and arranged at the same interval. The purge gas distribution module 54, the third gas distribution module 53, and the first gas distribution module 51 may be spaced apart from one another and arranged at the same angle with respect to the rotational shaft of the substrate supporting unit 3. The gas distribution unit 5 may include a plurality of purge gas distribution modules 54 and 54'. In this case, the purge gas distribution modules 54 and 54' may distribute the purge gas to different purge gas distribution spaces 540 and 540'. The purge gas distribution modules 54 and 54', the third gas distribution module 53, and the first gas distribution module 51 may be installed in the chamber lid 4 so as to be spaced apart from one another and arranged at the same interval. The purge gas distribution modules 54 and 54', the third gas distribution module 53, and the first gas distribution module 51 may be spaced apart from one another and arranged at the same angle with respect to the rotational shaft of the substrate supporting unit 3. For example, when the gas distribution unit 5 includes two purge gas distribution modules 54 and 54', the purge gas distribution modules 54 and 54', the third gas distribution module 53, and the first gas distribution module 51 may be spaced apart from one another and arranged at 90 degrees with respect to the rotational shaft of the substrate supporting unit 3. In this case, the first gas distribution module 51, the purge gas distribution module 54, the third gas distribution module 53, and the purge gas distribution module 54' may be arranged in order along the first rotational direction (the R1 arrow direction).

When the purge gas distribution modules 54 and 54' are provided, the second gas distribution module 52 may be installed in the chamber lid 4 so as to be disposed between the purge gas distribution modules 54 and 54'. In this case, the purge gas distribution module 54 may be installed in the chamber lid 4 so as to be disposed at a position spaced apart from the second gas distribution module 52 to one side. The purge gas distribution module 54' may be installed in the chamber lid 4 so as to be disposed at a position spaced apart from the second gas distribution module 52 to the other side. Therefore, the substrate processing apparatus 1 according to the present inventive concept may be implemented so that the process gas distributed by the second gas distribution module 52 is supplied to each of the purge gas distribution spaces 540 and 540'. The purge gas distribution modules 54 and 54' and the second gas distribution module 52 may be installed in the chamber lid 4 so as to be disposed on the same line.

Figure 9:
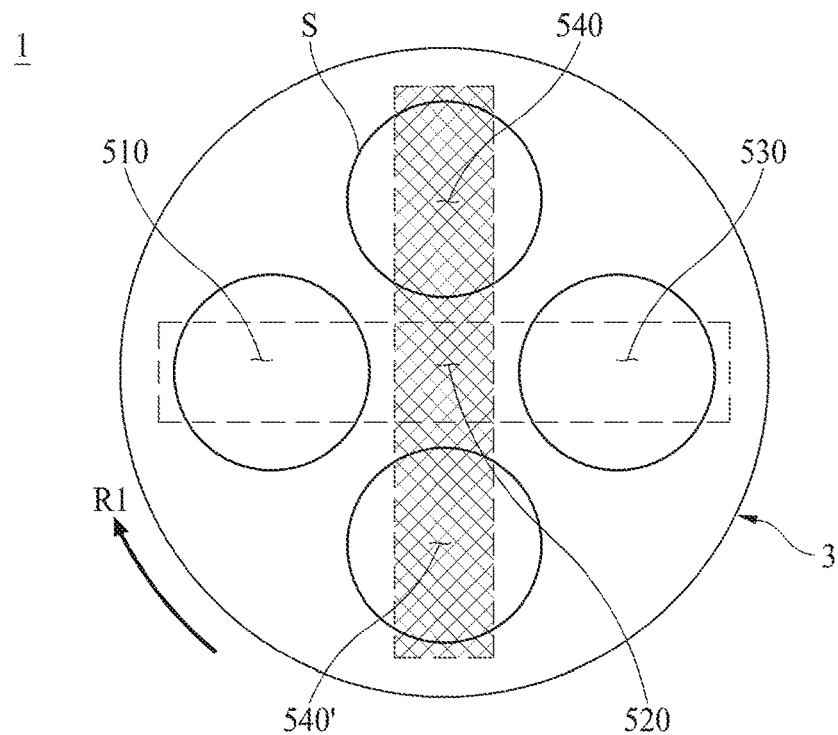

Referring to FIGS. 2 to 9, the substrate processing apparatus 1 according to the present inventive concept may operate as follows to perform the processing process and the exhaust process. In FIGS. 7 to 9, a hatched portion is a space to which the process gas and the purge gas are directly distributed, and an unhatched portion is a space to which the process gas and the purge gas are not directly distributed.

As illustrated in FIG. 7, when the first gas is distributed to the first gas distribution space 510, the first gas may also be distributed to the second gas distribution space 520. In this case, the second gas is not distributed to the third gas distribution space 530, and simultaneously, the purge gas is not distributed to the purge gas distribution spaces 540 and 540'. In the first gas distributed to the first gas distribution space 510 and the second gas distribution space 520, a higher amount of first gas is distributed in the substrate S placed in the first gas distribution space 510, but the first gas may be diffused to a whole process space including the third gas distribution space 530 and the purge gas distribution spaces 540 and 540'.

As illustrated in FIG. 8, when the second gas is distributed to the third gas distribution space 530, the second gas may also be distributed to the second gas distribution space 520. In this case, the first gas is not distributed to the first gas distribution space 510, and simultaneously, the purge gas is not distributed to the purge gas distribution spaces 540 and 540'. In the second gas distributed to the third gas distribution space 530 and the second gas distribution space 520, a higher amount of second gas is distributed in the substrate S placed in the third gas distribution space 530, but the second gas may be diffused to a whole process space including the first gas distribution space 510 and the purge gas distribution spaces 540 and 540'.

As illustrated in FIG. 9, when the purge gas is distributed to the purge gas distribution spaces 540 and 540', the purge gas may also be distributed to the second gas distribution space 520. In this case, the first gas is not distributed to the first gas distribution space 510, and simultaneously, the second gas is not distributed to the third gas distribution space 530. In the purge gas distributed to the purge gas distribution spaces 540 and 540' and the second gas distribution space 520, a higher amount of purge gas is distributed in the substrate S placed in the purge gas distribution spaces 540 and 540', but the purge gas may be diffused to a whole process space including the first gas distribution space 510 and the third gas distribution space 530.

Figure 10:
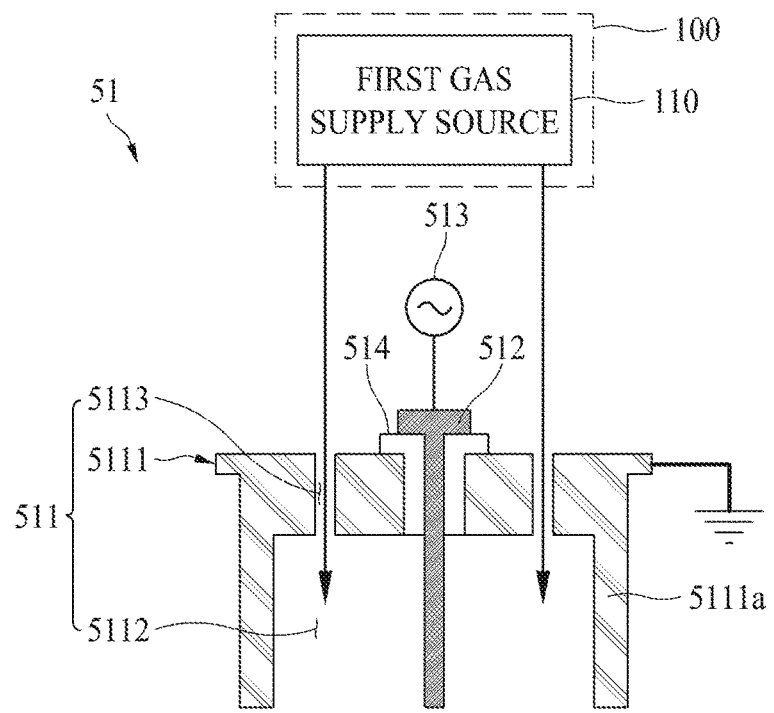
FIGS. 10 and 11 are schematic cross-sectional views, taken along line I-I of FIG. 2, of a first gas distribution module in a substrate processing apparatus according to the present inventive concept.

Referring to FIGS. 2 and 10, in a substrate processing apparatus 1 according to a modified embodiment of the present inventive concept, the first gas distribution module 51 may activate the first gas by using plasma and may distribute an activated first gas. The first gas distribution module 51 may include a first ground electrode 511 (illustrated in FIG. 10) and a first plasma electrode 512 (illustrated in FIG. 10).

The first ground electrode 511 distributes the first gas. The first ground electrode 511 may be installed in the chamber lid 4. The first ground electrode 511 may be inserted into the first installation hole 41, and thus, may be installed in the chamber lid 4. The first ground electrode 511 may include a first housing 5111 (illustrated in FIG. 10), a first through groove 5112 (illustrated in FIG. 10), and a first supply hole 5113 (illustrated in FIG. 10).

The first housing 5111 may be inserted into the first installation hole 41, and thus, may be installed in the chamber lid 4. The first housing 5111 may be electrically connected to the chamber lid 4, and thus, may be electrically grounded through the chamber lid 4. The first housing 5111 may be provided in a wholly rectangular parallelepiped shape, but without being limited thereto, the first housing 5111 may be provided in another shape such as a cylindrical shape which is installed in the chamber lid 4 and enables distribution of the first gas.

The first through groove 5112 may be provided in the first housing 5111. The first through groove 5112 may be disposed in the first housing 5111. The first housing 5111 may be provided in a shape where one side thereof is opened through the first through groove 5112. The first housing 5111 may be installed in the chamber lid 4 in order for the opened one side to face the substrate supporting unit 3 (illustrated in FIG. 2).

The first supply hole 5113 may be provided to pass through the first housing 5111. The first supply hole 5113 may be provided to communicate with the first through groove 5112. The first supply hole 5113 may be connected to the first gas supply source 110. The first gas supplied by the first gas supply source 110 may be supplied to the first through groove 5112 through the first supply hole 5113. The first supply hole 5113 may be provided in plurality in the first housing 5111. In this case, the first supply holes 5113 may be disposed on both sides of the first plasma electrode 512.

The first plasma electrode 512 may be installed in the first housing 5111. The first plasma electrode 512 may be inserted into and installed in a first insulation member 514, and thus, may be installed in the first housing 5111. The first insulation member 514 electrically insulates the first housing 5111 from the first plasma electrode 512. A portion of the first plasma electrode 512 may be disposed in the first through groove 5112.

The first plasma electrode 512 generates plasma from the first gas supplied to the first through groove 5112, based on a plasma power applied from a first plasma power supply source 513. In this case, plasma may be generated from an electric field which is generated between the first plasma electrode 512 and a first sidewall 5111*a* of the first housing 5111, based on the plasma power. Accordingly, the first gas may be activated by the plasma and distributed.

Figure 11:
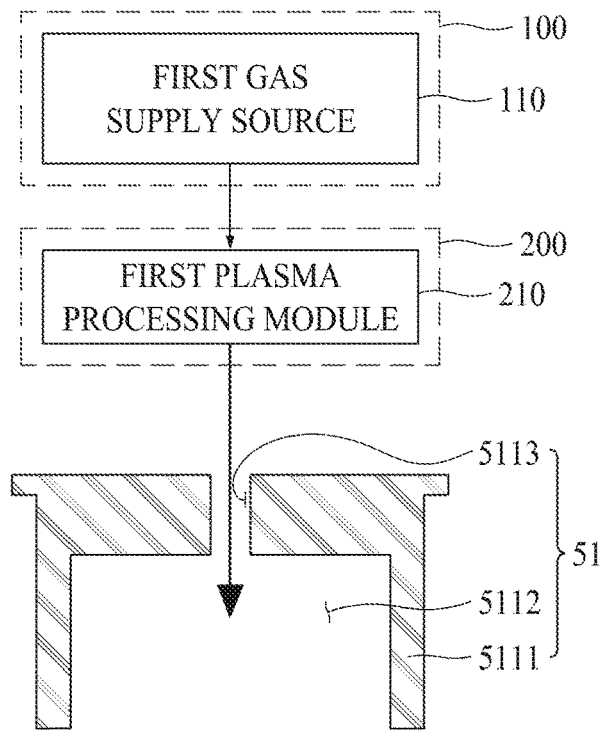

Referring to FIGS. 2 and 11, the first gas distribution module 51 may be supplied with the first gas, activated by the plasma, from a plasma processing unit 200 and may distribute the first gas activated by the plasma. In this case, the first gas distribution module 51 may include a first housing 5111 (illustrated in FIG. 11), a first through groove 5112 (illustrated in FIG. 11), and a first supply hole 5113 (illustrated in FIG. 11).

The first housing 5111 may be inserted into the first installation hole 41, and thus, may be installed in the chamber lid 4. The first housing 5111 may be supplied with the first gas, activated by the plasma, from the plasma processing unit 200. Accordingly, the first housing 5111 may distribute the first gas activated by the plasma.

The first through groove 5112 may be provided in the first housing 5111. The first through groove 5112 may be disposed in the first housing 5111. The first housing 5111 may be provided in a shape where one side thereof is opened through the first through groove 5112. The first housing 5111 may be installed in the chamber lid 4 in order for the opened one side to face the substrate supporting unit 3 (illustrated in FIG. 2).

The first supply hole 5113 may be provided to pass through the first housing 5111. The first supply hole 5113 may be provided to communicate with the first through groove 5112. The first supply hole 5113 may be connected to the plasma processing unit 200. The plasma processing unit 200 may include a first plasma processing module 210 which activates the first gas by using the plasma. The first supply hole 5113 may be connected to the first plasma processing module 210. The first gas activated through the first plasma processing module 210 may be supplied to the first through groove 5112 through the first supply hole 5113. The first supply hole 5113 may be provided in plurality in the first housing 5111.

As described above, in a case where the first gas distribution module 51 activates the first gas by using the plasma to distribute an activated first gas, the second gas distribution module 52 may also activate the first gas by using the plasma to distribute an activated first gas. In this case, although not shown, the second gas distribution module 52 may be implemented to activate the first gas by using a second ground electrode and a second plasma electrode and distribute an activated first gas. The second gas distribution module 52 may be implemented to distribute the first gas activated through the first plasma processing module 210.

Figure 12:
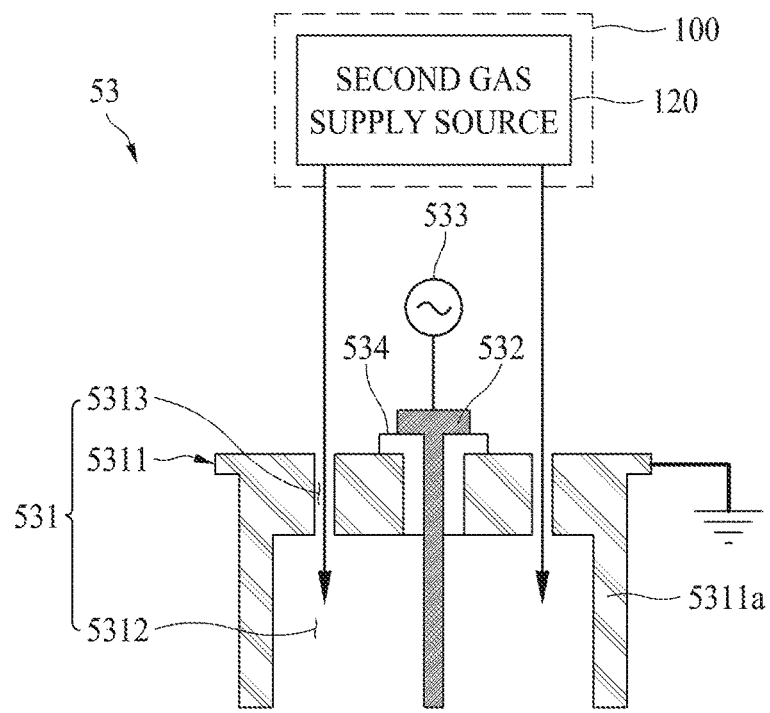
FIGS. 12 and 13 are schematic cross-sectional views, taken along line II-II of FIG. 2, of a third gas distribution module in a substrate processing apparatus according to the present inventive concept.

Referring to FIGS. 2 and 12, in a substrate processing apparatus 1 according to a modified embodiment of the present inventive concept, the third gas distribution module 53 may activate the second gas by using plasma and may distribute an activated second gas. The third gas distribution module 53 may include a third ground electrode 531 (illustrated in FIG. 12) and a third plasma electrode 532 (illustrated in FIG. 12).

The third ground electrode 531 distributes the second gas. The third ground electrode 531 may be installed in the chamber lid 4. The third ground electrode 531 may be inserted into the third installation hole 43, and thus, may be installed in the chamber lid 4. The third ground electrode 531 may include a third housing 5311 (illustrated in FIG. 12), a third through groove 5312 (illustrated in FIG. 12), and a third supply hole 5313 (illustrated in FIG. 12).

The third housing 5311 may be inserted into the third installation hole 43, and thus, may be installed in the chamber lid 4. The third housing 5311 may be electrically connected to the chamber lid 4, and thus, may be electrically grounded through the chamber lid 4. The third housing 5311 may be provided in a wholly rectangular parallelepiped shape, but without being limited thereto, the third housing 5311 may be provided in another shape such as a cylindrical shape which is installed in the chamber lid 4 and enables distribution of the second gas.

The third through groove 5312 may be provided in the third housing 5311. The third through groove 5312 may be disposed in the third housing 5311. The third housing 5311 may be provided in a shape where one side thereof is opened through the third through groove 5312. The third housing 5311 may be installed in the chamber lid 4 in order for the opened one side to face the substrate supporting unit 3 (illustrated in FIG. 2).

The third supply hole 5313 may be provided to pass through the third housing 5311. The third supply hole 5313 may be provided to communicate with the third through groove 5312. The third supply hole 5313 may be connected to the second gas supply source 120. The second gas supplied by the second gas supply source 120 may be supplied to the third through groove 5312 through the third supply hole 5313. The third supply hole 5313 may be provided in plurality in the third housing 5311. In this case, the third supply holes 5313 may be disposed on both sides of the third plasma electrode 532.

The third plasma electrode 532 may be installed in the third housing 5311. The third plasma electrode 532 may be inserted into and installed in a third insulation member 534, and thus, may be installed in the third housing 5311. The third insulation member 534 electrically insulates the third housing 5311 from the third plasma electrode 532. A portion of the third plasma electrode 532 may be disposed in the third through groove 5312.

The third plasma electrode 532 generates plasma from the second gas supplied to the third through groove 5312, based on a plasma power applied from a second plasma power supply source 533. In this case, plasma may be generated from an electric field which is generated between the third plasma electrode 532 and a third sidewall 5311*a* of the third housing 5311, based on the plasma power. Accordingly, the second gas may be activated by the plasma and distributed.

Figure 13:
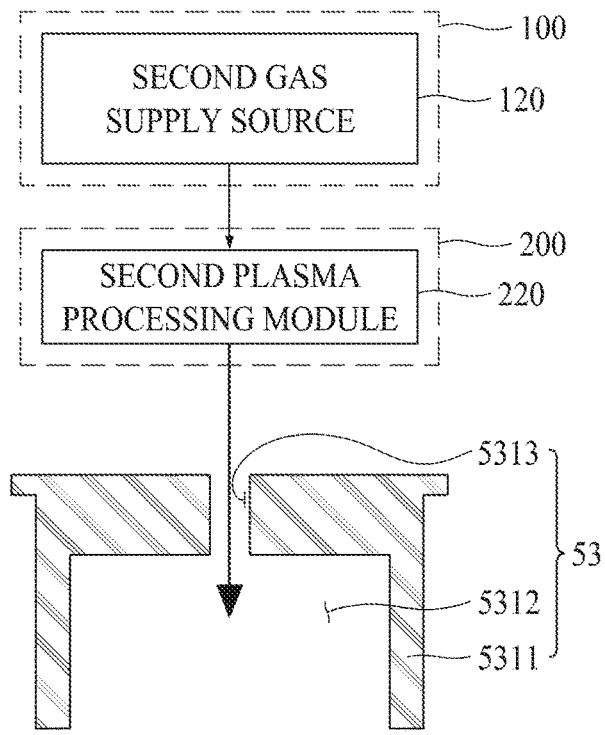

Referring to FIGS. 2 and 13, the third gas distribution module 53 may be supplied with the second gas, activated by the plasma, from the plasma processing unit 200 and may distribute the second gas activated by the plasma. In this case, the third gas distribution module 53 may include a third housing 5311 (illustrated in FIG. 13), a third through groove 5312 (illustrated in FIG. 13), and a third supply hole 5313 (illustrated in FIG. 13).

The third housing 5311 may be inserted into the third installation hole 43, and thus, may be installed in the chamber lid 4. The third housing 5311 may be supplied with the second gas, activated by the plasma, from the plasma processing unit 200. Accordingly, the third housing 5311 may distribute the second gas activated by the plasma.

The third through groove 5312 may be provided in the third housing 5311. The third through groove 5312 may be disposed in the third housing 5311. The third housing 5311 may be provided in a shape where one side thereof is opened through the third through groove 5312. The third housing 5311 may be installed in the chamber lid 4 in order for the opened one side to face the substrate supporting unit 3 (illustrated in FIG. 2).

The third supply hole 5313 may be provided to pass through the third housing 5311. The third supply hole 5313 may be provided to communicate with the third through groove 5312. The third supply hole 5313 may be connected to the plasma processing unit 200. The plasma processing unit 200 may include a second plasma processing module 220 which activates the second gas by using the plasma. The third supply hole 5313 may be connected to the second plasma processing module 220. The second gas activated through the second plasma processing module 220 may be supplied to the third through groove 5312 through the third supply hole 5313. The third supply hole 5313 may be provided in plurality in the third housing 5311.

As described above, in a case where the third gas distribution module 53 activates the second gas by using the plasma to distribute an activated second gas, the second gas distribution module 52 may also activate the second gas by using the plasma to distribute an activated second gas. In this case, although not shown, the second gas distribution module 52 may be implemented to activate the second gas by using the second ground electrode and the second plasma electrode and distribute an activated first gas. The second gas distribution module 52 may be implemented to distribute the second gas activated through the second plasma processing module 220.

Referring to FIGS. 2 and 10, a gas distribution unit 5 according to a modified embodiment of the present inventive concept may include the first gas distribution module 51 and the second gas distribution module 52. In comparison with the above-described gas distribution unit 5, the gas distribution unit 5 according to a modified embodiment of the present inventive concept may be implemented to distribute a processing gas by using only the first gas distribution module 51 and the second gas distribution module 52. In this case, the gas distribution unit 5 according to a modified embodiment of the present inventive concept may not include the third gas distribution module 53. The gas distribution unit 5 according to a modified embodiment of the present inventive concept may include the third gas distribution module 53 and may be implemented so that the third gas distribution module 53 does not distribute the processing gas while the processing gas is being distributed by using only the first gas distribution module 51 and the second gas distribution module 52. In this case, the gas distribution unit 5 according to a modified embodiment of the present inventive concept may further include the purge gas distribution module 54 and may be implemented so that the purge gas distribution module 54 does not distribute a purge gas while the processing gas is being distributed by using only the first gas distribution module 51 and the second gas distribution module 52.

In the gas distribution unit 5 according to a modified embodiment of the present inventive concept, when the first gas distribution module 51 distributes a processing gas to the first gas distribution space 510, the second gas distribution module 52 may distribute a processing gas, which is the same as the processing gas distributed by the first gas distribution module 51, to the second gas distribution space 520.

When the first gas distribution module 51 distributes a source gas as the processing gas to the first gas distribution space 510, the second gas distribution module 52 may distribute the source gas to the second gas distribution space 520. Therefore, a substrate processing process using the source gas may be performed in the process chamber 2.

When the first gas distribution module 51 distributes a reactant gas as the processing gas to the first gas distribution space 510, the second gas distribution module 52 may distribute the reactant gas to the second gas distribution space 520. Therefore, a substrate processing process using the reactant gas may be performed in the process chamber 2.

When the first gas distribution module 51 distributes the purge gas as the processing gas to the first gas distribution space 510, the second gas distribution module 52 may distribute the purge gas to the second gas distribution space 520. Therefore, a process of purging a process gas may be performed in the process chamber 2.

The gas distribution unit 5 according to a modified embodiment of the present inventive concept may be implemented as a gas distribution apparatus according to a modified embodiment of the present inventive concept. Also, the gas distribution unit 5 according to a modified embodiment of the present inventive concept may be applied to each of the substrate processing apparatus 1 according to the present inventive concept and the substrate processing apparatus 1 according to a modified embodiment of the present inventive concept described above.

Hereinafter, an embodiment of a substrate processing method according to the present inventive concept will be described in detail with reference to the accompanying drawings.

Referring to FIGS. 2 to 13, the substrate processing method according to the present inventive concept distributes a processing gas to the inside of the process chamber 2 to process the substrate S. The substrate processing method according to the present inventive concept may be performed by the above-described substrate processing apparatus 1 according to the present inventive concept. The substrate processing method according to the present inventive concept may include the following process.

First, a source gas is distributed. Such a process may be performed by the gas distribution unit 5 distributing the source gas to the first gas distribution space 510 and the second gas distribution space 520. A process of distributing the source gas may be performed by the first gas distribution module 51 distributing the source gas to the first gas distribution space 510 and by the second gas distribution module 52 distributing the source gas to the second gas distribution space 520. In this case, the process of distributing the source gas may be performed by distributing the source gas activated by plasma. While the process of distributing the source gas is being performed, the third gas distribution module 53 may stop distribution of the reactant gas, and the purge gas distribution module 54 may stop distribution of the purge gas. While the process of distributing the source gas is being performed, a process of rotating the substrates S by using the substrate supporting unit 3 may be performed together.

Subsequently, the source gas is purged. Such a process may be performed by the gas distribution unit 5 distributing the purge gas to the purge gas distribution space 540 and the second gas distribution space 520. A process of purging the source gas may be performed by the purge gas distribution module 54 distributing the purge gas to the purge gas distribution space 540 and by the second gas distribution module 52 distributing the purge gas to the second gas distribution space 520. While the process of purging the source gas is being performed, the first gas distribution module 51 may stop distribution of the source gas, and the third gas distribution module 53 may stop distribution of the reactant gas. While the process of purging the source gas is being performed, a process of rotating the substrates S by using the substrate supporting unit 3 may be performed together.

Subsequently, the reactant is distributed. Such a process may be performed by the gas distribution unit 5 distributing the reactant gas to the third gas distribution space 530 and the second gas distribution space 520. A process of distributing the reactant gas may be performed by the third gas distribution module 53 distributing the reactant gas to the third gas distribution space 530 and by the second gas distribution module 52 distributing the reactant gas to the second gas distribution space 520. In this case, the process of distributing the reactant gas may be performed by distributing the reactant gas activated by plasma. While the process of distributing the reactant gas is being performed, the first gas distribution module 51 may stop distribution of the source gas, and the purge gas distribution module 54 may stop distribution of the purge gas. While the process of distributing the reactant gas is being performed, a process of rotating the substrates S by using the substrate supporting unit 3 may be performed together.

Subsequently, the reactant gas is purged. Such a process may be performed by the gas distribution unit 5 distributing the purge gas to the purge gas distribution space 540 and the second gas distribution space 520. A process of purging the reactant gas may be performed by the purge gas distribution module 54 distributing the purge gas to the purge gas distribution space 540 and by the second gas distribution module 52 distributing the purge gas to the second gas distribution space 520. While the process of purging the reactant gas is being performed, the first gas distribution module 51 may stop distribution of the source gas, and the third gas distribution module 53 may stop distribution of the reactant gas. While the process of purging the reactant gas is being performed, a process of rotating the substrates S by using the substrate supporting unit 3 may be performed together.

Figure 14:
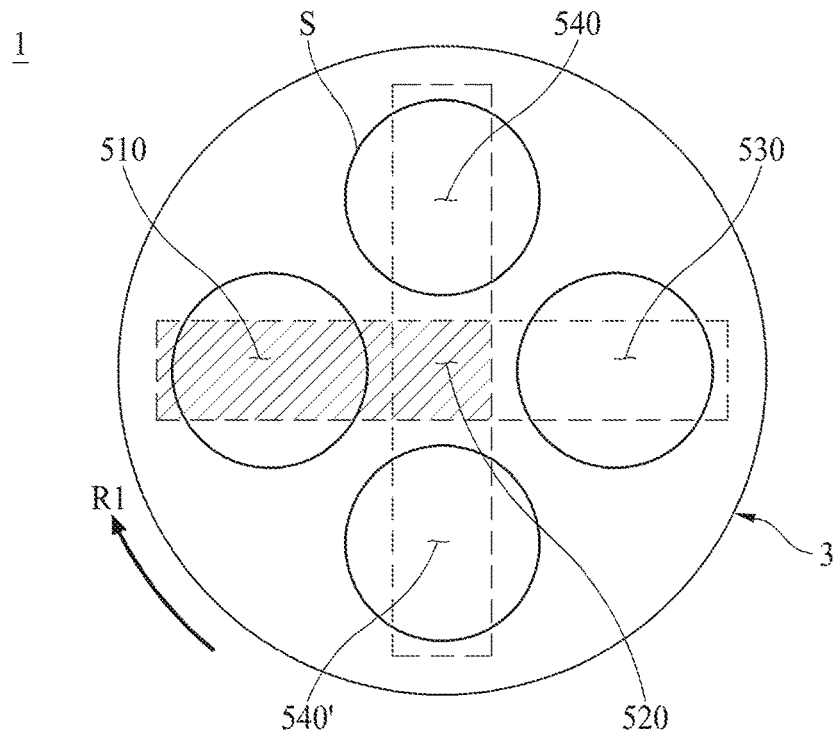
FIGS. 14 to 23 are schematic process views for describing a substrate processing method according to the present inventive concept.
Figure 15:
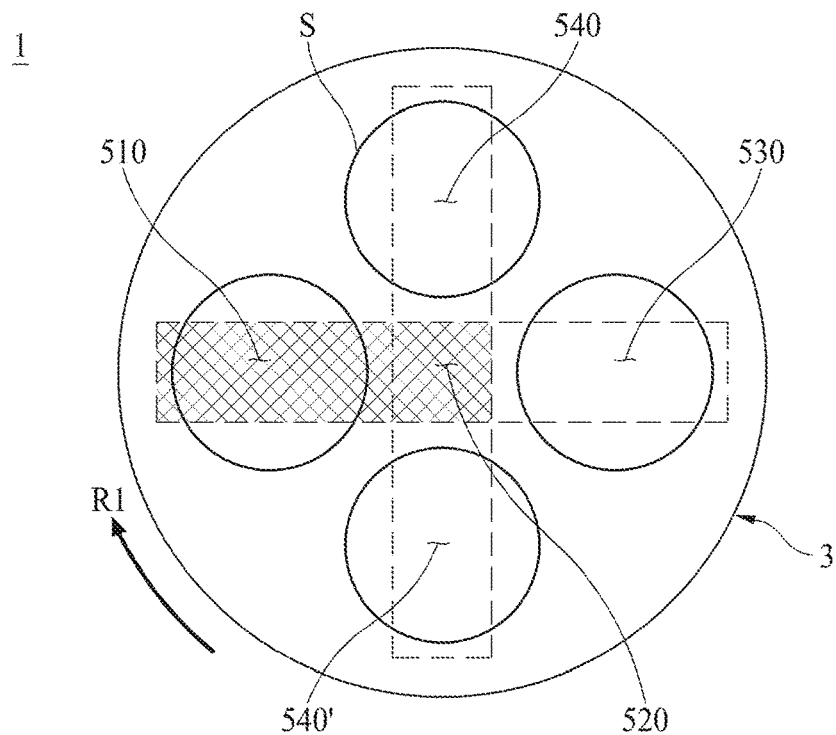
Figure 16:
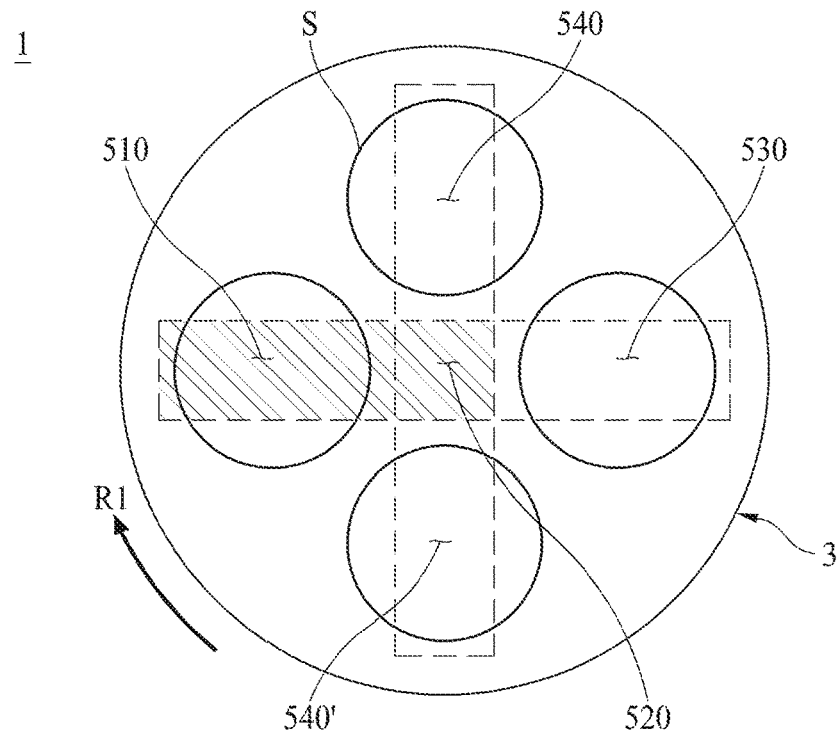

Referring to FIGS. 2 to 16, the substrate processing method according to a modified embodiment of the present inventive concept may include the following process. The substrate processing method according to a modified embodiment of the present inventive concept may be performed by a substrate processing apparatus to which the above-described substrate processing unit 5 according to a modified embodiment of the present inventive concept is applied. In FIGS. 14 to 16, a hatched portion is a space to which the process gas and the purge gas are directly distributed, and an unhatched portion is a space to which the process gas and the purge gas are not directly distributed.

First, as illustrated in FIG. 14, a source gas is distributed to the first gas distribution space 510 and the second gas distribution space 520. Such a process may be performed by the first gas distribution module 51 distributing the source gas to the first gas distribution space 510 and simultaneously by the second gas distribution module 52 distributing the source gas to the second gas distribution space 520. Therefore, a substrate processing process using the source gas may be performed in the process chamber 2. While the process of distributing the source gas to the first gas distribution space 510 and the second gas distribution space 520 is being performed, the substrate supporting unit 3 may rotate the substrates S along a rotational path.

Subsequently, as illustrated in FIG. 15, a purge gas is distributed to the first gas distribution space 510 and the second gas distribution space 520. Such a process may be performed by the first gas distribution module 51 distributing the purge gas to the first gas distribution space 510 and simultaneously by the second gas distribution module 52 distributing the purge gas to the second gas distribution space 520. Therefore, a process of purging the source gas may be performed in the process chamber 2. While the process of distributing the purge gas to the first gas distribution space 510 and the second gas distribution space 520 is being performed, the substrate supporting unit 3 may rotate the substrates S along the rotational path.

Subsequently, as illustrated in FIG. 16, a reactant gas is distributed to the first gas distribution space 510 and the second gas distribution space 520. Such a process may be performed by the first gas distribution module 51 distributing the reactant gas to the first gas distribution space 510 and simultaneously by the second gas distribution module 52 distributing the reactant gas to the second gas distribution space 520. Therefore, a substrate processing process using the reactant gas may be performed in the process chamber 2. While the process of distributing the reactant gas to the first gas distribution space 510 and the second gas distribution space 520 is being performed, the substrate supporting unit 3 may rotate the substrates S along the rotational path.

Through the above-described processes, the substrate processing method according to a modified embodiment of the present inventive concept may perform a processing process on the substrate S. The substrate processing method according to a modified embodiment of the present inventive concept may include a process of distributing the reactant gas to the first gas distribution space 510 and the second gas distribution space 520 and then distributing the purge gas to the first gas distribution space 510 and the second gas distribution space 520.

A process of distributing the reactant gas to the first gas distribution space 510 and the second gas distribution space 520 may be performed by the first gas distribution module 51 distributing the purge gas to the first gas distribution space 510 and simultaneously by the second gas distribution module 52 distributing the purge gas to the second gas distribution space 520 after the process of distributing the reactant gas to the first gas distribution space 510 and the second gas distribution space 520 is completed. Therefore, a process of purging the reactant gas may be performed in the process chamber 2. While a process of distributing the purge gas to the first gas distribution space 510 and the second gas distribution space 520 is being performed, the substrate supporting unit 3 may rotate the substrates S along the rotational path.

Figure 17:
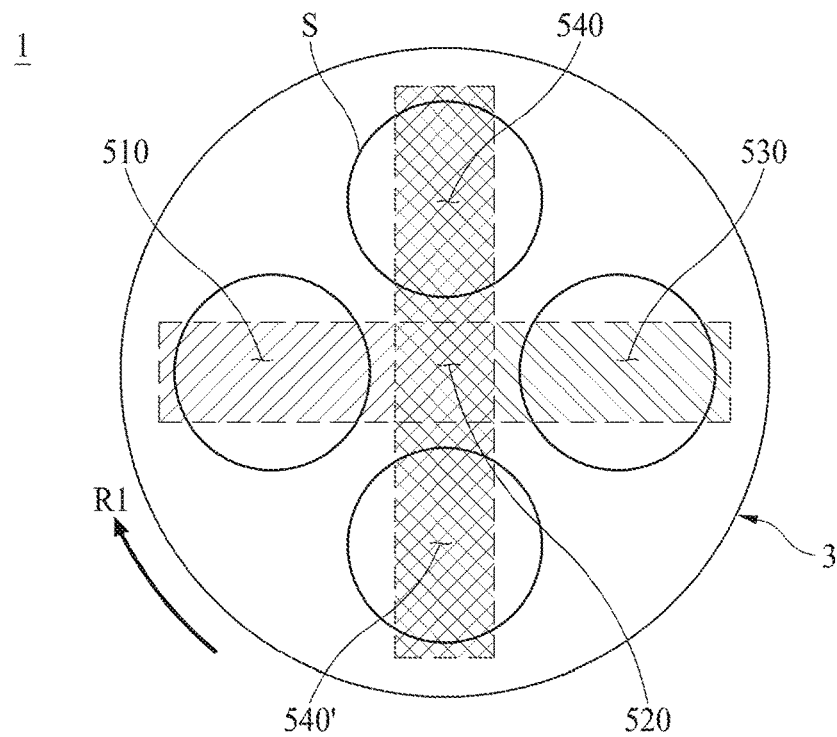

Referring to FIGS. 2 to 17, a substrate processing method according to another modified embodiment of the present inventive concept may include the following process. In FIG. 17, a hatched portion is a space to which the process gas and the purge gas are directly distributed, and an unhatched portion is a space to which the process gas and the purge gas are not directly distributed.

First, as illustrated in FIG. 17, a source gas is distributed to the first gas distribution space 510. Such a process may be performed by the first gas distribution module 51 distributing the source gas to the first gas distribution space 510. Therefore, a substrate processing process using the source gas may be performed on a substrate S placed in the first gas distribution space 510 in the process chamber 2. While the process of distributing the source gas to the first gas distribution space 510 is being performed, the substrate supporting unit 3 may rotate the substrates S along a rotational path.

Subsequently, as illustrated in FIG. 17, a purge gas is distributed to the second gas distribution space 520. Such a process may be performed by the second gas distribution module 52 distributing the purge gas to the second gas distribution space 520. Therefore, the first gas distribution space 510 and the second gas distribution space 530 may be spatially divided by the purge gas in the process chamber 2. While the process of distributing the purge gas to the second gas distribution space 520 is being performed, the substrate supporting unit 3 may rotate the substrates S along the rotational path.

Subsequently, as illustrated in FIG. 17, a reactant gas is distributed to the third gas distribution space 530. Such a process may be performed by the third gas distribution module 53 distributing the reactant gas to the third gas distribution space 530. Therefore, a substrate processing process using the reactant gas may be performed on a substrate S placed in the third gas distribution space 530 in the process chamber 2. While the process of distributing the reactant gas to the third gas distribution space 530 is being performed, the substrate supporting unit 3 may rotate the substrates S along the rotational path.

Here, the process of distributing the source gas to the first gas distribution space, the process of distributing the purge gas to the second gas distribution space, and the process of distributing the reactant gas to the third gas distribution space may be simultaneously performed. Therefore, in a state where the first gas distribution space 510 and the third gas distribution space 530 are spatially divided by the purge gas, the substrates S may undergo a processing process based on the source gas while passing through the first gas distribution space 510 and may undergo a processing process based on the reactant gas while passing through the third gas distribution space 530.

Through the above-described processes, the substrate processing method according to another modified embodiment of the present inventive concept may perform a processing process on the substrates S. The substrate processing method according to another modified embodiment of the present inventive concept may further include a process of distributing a purge gas to the purge gas distribution space.

The process of distributing the purge gas to the purge gas distribution space may be performed by the purge gas distribution module 54 distributing the purge gas to the purge gas distribution spaces 540 and 540'. The process of distributing the purge gas to the purge gas distribution space, the process of distributing the source gas to the first gas distribution space, the process of distributing the purge gas to the second gas distribution space, and the process of distributing the reactant gas to the third gas distribution space may be simultaneously performed. Therefore, in a state where a dividing force for spatially dividing the first gas distribution space 510 and the third gas distribution space 530 by using the purge gas in the process chamber 2 increases, the substrates S may undergo a processing process based on the source gas while passing through the first gas distribution space 510 and may undergo a processing process based on the reactant gas while passing through the third gas distribution space 530.

Referring to FIGS. 12 and 17, the substrate processing method according to another modified embodiment of the present inventive concept may include a time division processing process and a space division processing process.

The time division processing process processes a substrate in a time division mode of changing and distributing a processing gas in the process chamber 2 with time. By performing the time division processing process, a substrate processing process using a source gas, a process of purging the source gas, a substrate processing process using a reactant gas, and a process of purging the reactant gas may be sequentially performed in the process chamber 2.

The space division processing process processes a substrate in a space division mode of distributing different processing gases to spaces of the process chamber 2. By performing the space division processing process, a substrate processing process using a source gas and a substrate processing process using a reactant gas may be performed together in a state where the spaces are divided by using the purge gas in the process chamber 2.

As described above, the substrate processing method according to another modified embodiment of the present inventive concept may be implemented to perform the time division processing process and the space division processing process by using one substrate processing apparatus 1. Accordingly, in substrate processing method according to another modified embodiment of the present inventive concept, an atomic layer deposition (ALD) process may be performed through the time division processing process, and simultaneously, the productivity of the ALD process may increase through space division processing process.

The substrate processing method according to another modified embodiment of the present inventive concept may further include a repetition processing process. The repetition processing process alternately repeats the time division processing process and the space division processing process. Therefore, the substrate processing method according to another modified embodiment of the present inventive concept may be implemented to be performed by alternately repeating the time division processing process and the space division processing process by using one substrate processing apparatus 1.

Here, the time division processing process may include the following process.

First, as illustrated in FIG. 14, the source gas is distributed to the first gas distribution space 510 and the second gas distribution space 520. Such a process may be performed by the first gas distribution module 51 distributing the source gas to the first gas distribution space 510 and simultaneously by the second gas distribution module 52 distributing the source gas to the second gas distribution space 520. Therefore, the substrate processing process using the source gas may be performed in the process chamber 2. While the process of distributing the source gas to the first gas distribution space 510 and the second gas distribution space 520 is being performed, the substrate supporting unit 3 may rotate the substrates S along the rotational path.

Subsequently, as illustrated in FIG. 15, the purge gas is distributed to the first gas distribution space 510 and the second gas distribution space 520. Such a process may be performed by the first gas distribution module 51 distributing the purge gas to the first gas distribution space 510 and simultaneously by the second gas distribution module 52 distributing the purge gas to the second gas distribution space 520. Therefore, the process of purging the source gas may be performed in the process chamber 2. While the process of distributing the purge gas to the first gas distribution space 510 and the second gas distribution space 520 is being performed, the substrate supporting unit 3 may rotate the substrates S along the rotational path.

Subsequently, as illustrated in FIG. 16, the reactant gas is distributed to the first gas distribution space 510 and the second gas distribution space 520. Such a process may be performed by the first gas distribution module 51 distributing the reactant gas to the first gas distribution space 510 and simultaneously by the second gas distribution module 52 distributing the reactant gas to the second gas distribution space 520. Therefore, the substrate processing process using the reactant gas may be performed in the process chamber 2. While the process of distributing the reactant gas to the first gas distribution space 510 and the second gas distribution space 520 is being performed, the substrate supporting unit 3 may rotate the substrates S along the rotational path.

Through the above-described processes, the time division processing process may be performed. The time division processing process may further include a process of distributing the reactant gas to the first gas distribution space 510 and the second gas distribution space 520 and then distributing the purge gas to the first gas distribution space 510 and the second gas distribution space 520.

The process of distributing the reactant gas to the first gas distribution space 510 and the second gas distribution space 520 may be performed by the first gas distribution module 51 distributing the purge gas to the first gas distribution space 510 and simultaneously by the second gas distribution module 52 distributing the purge gas to the second gas distribution space 520 after the process of distributing the reactant gas to the first gas distribution space 510 and the second gas distribution space 520 is completed. Therefore, the process of purging the reactant gas may be performed in the process chamber 2. While the process of distributing the purge gas to the first gas distribution space 510 and the second gas distribution space 520 is being performed, the substrate supporting unit 3 may rotate the substrates S along the rotational path.

Here, the time division processing process may include the following process.

First, as illustrated in FIG. 7, a source gas is distributed to the first gas distribution space 510 and the second gas distribution space 520. Such a process may be performed by the first gas distribution module 51 distributing the source gas to the first gas distribution space 510 and by the second gas distribution module 52 distributing the source gas to the second gas distribution space 520. While the process of distributing the source gas to the first gas distribution space 510 and the second gas distribution space 520 is being performed, the substrate supporting unit 3 may rotate the substrates S along the rotational path.

Subsequently, as illustrated in FIG. 9, the source gas is purged. Such a process may be performed by the gas distribution unit 5 distributing the purge gas to the purge gas distribution space 540 and the second gas distribution space 520. A process of purging the source gas may be performed by the purge gas distribution module 54 distributing the purge gas to the purge gas distribution space 540 and by the second gas distribution module 52 distributing the purge gas to the second gas distribution space 520. While the process of purging the source gas is being performed, the substrate supporting unit 3 may rotate the substrates S along the rotational path.

Subsequently, as illustrated in FIG. 8, a reactant gas is distributed to the first gas distribution space 510 and the second gas distribution space 520. Such a process may be performed by the third gas distribution module 53 distributing the reactant gas to the third gas distribution space 530 and by the second gas distribution module 52 distributing the reactant gas to the second gas distribution space 520. While the process of distributing the reactant gas to the third gas distribution space 530 and the second gas distribution space 520 is being performed, the substrate supporting unit 3 may rotate the substrates S along the rotational path.

Subsequently, as illustrated in FIG. 9, the reactant gas is purged. Such a process may be performed by the gas distribution unit 5 distributing the purge gas to the purge gas distribution space 540 and the second gas distribution space 520. A process of purging the reactant gas may be performed by the purge gas distribution module 54 distributing the purge gas to the purge gas distribution space 540 and by the second gas distribution module 52 distributing the purge gas to the second gas distribution space 520. While the process of purging the reactant gas is being performed, the substrate supporting unit 3 may rotate the substrates S along the rotational path.

Here, the space division processing process may include the following process.

First, as illustrated in FIG. 17, a source gas is distributed to the first gas distribution space 510. Such a process may be performed by the first gas distribution module 51 distributing the source gas to the first gas distribution space 510. Therefore, a substrate processing process using the source gas may be performed on a substrate S placed in the first gas distribution space 510 in the process chamber 2. While the process of distributing the source gas to the first gas distribution space 510 is being performed, the substrate supporting unit 3 may rotate the substrates S along the rotational path.

Subsequently, as illustrated in FIG. 17, a purge gas is distributed to the second gas distribution space 520. Such a process may be performed by the second gas distribution module 52 distributing the purge gas to the second gas distribution space 520. Therefore, the first gas distribution space 510 and the second gas distribution space 530 may be spatially divided by the purge gas in the process chamber 2. While the process of distributing the purge gas to the second gas distribution space 520 is being performed, the substrate supporting unit 3 may rotate the substrates S along the rotational path.

Subsequently, as illustrated in FIG. 17, a reactant gas is distributed to the third gas distribution space 530. Such a process may be performed by the third gas distribution module 53 distributing the reactant gas to the third gas distribution space 530. Therefore, a substrate processing process using the reactant gas may be performed on a substrate S placed in the third gas distribution space 530 in the process chamber 2. While the process of distributing the reactant gas to the third gas distribution space 530 is being performed, the substrate supporting unit 3 may rotate the substrates S along the rotational path.

The process of distributing the source gas to the first gas distribution space, the process of distributing the purge gas to the second gas distribution space, and the process of distributing the reactant gas to the third gas distribution space may be simultaneously performed. Therefore, in a state where the first gas distribution space 510 and the third gas distribution space 530 are spatially divided by the purge gas, the substrates S may undergo a processing process based on the source gas while passing through the first gas distribution space 510 and may undergo a processing process based on the reactant gas while passing through the third gas distribution space 530.

Through the above-described processes, the space division processing process may perform a processing process on the substrates S. The space division processing process may further include a process of distributing a purge gas to the purge gas distribution space.

The process of distributing the purge gas to the purge gas distribution space may be performed by the purge gas distribution module 54 distributing the purge gas to the purge gas distribution spaces 540 and 540'. The process of distributing the purge gas to the purge gas distribution space, the process of distributing the source gas to the first gas distribution space, the process of distributing the purge gas to the second gas distribution space, and the process of distributing the reactant gas to the third gas distribution space may be simultaneously performed. Therefore, in a state where a dividing force for spatially dividing the first gas distribution space 510 and the third gas distribution space 530 by using the purge gas in the process chamber 2 increases, the substrates S may undergo a processing process based on the source gas while passing through the first gas distribution space 510 and may undergo a processing process based on the reactant gas while passing through the third gas distribution space 530.

Here, the substrate processing method according to another modified embodiment of the present inventive concept may include the following modified embodiments of the time division processing process.

Figure 18:
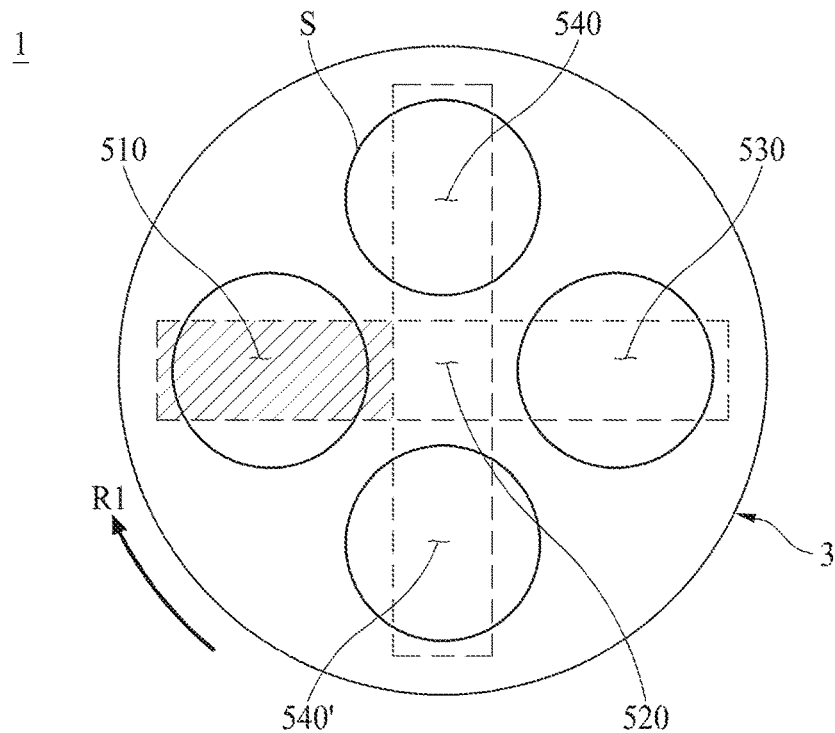
Figure 19:
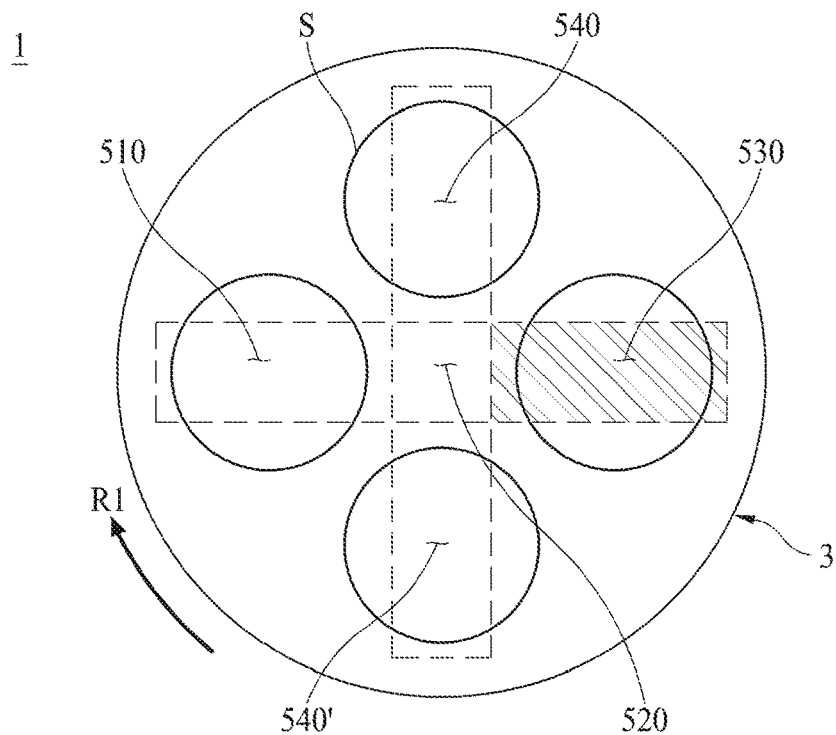

Referring to FIGS. 18 and 19, a time division processing process according to a first modification embodiment may include the following process. In FIGS. 18 and 19, a hatched portion is a space to which a process gas is directly distributed, and an unhatched portion is a space to which the process gas is not directly distributed.

First, as illustrated in FIG. 18, a source gas is distributed to only the first gas distribution space 510. Such a process may be performed by only the first gas distribution module 51 distributing the source gas to the first gas distribution space 510. Therefore, a substrate processing process using the source gas distributed from the first gas distribution module 51 may be performed in the process chamber 2. While the process of distributing the source gas to only the first gas distribution space 510 is being performed, the substrate supporting unit 3 may rotate the substrates S along the rotational path. While the process of distributing the source gas to only the first gas distribution space 510 is being performed, the second gas distribution module 52, the third gas distribution module 53, and the purge gas distribution module 54 do not distribute a gas.

Subsequently, the source gas is purged. Such a process may be performed by the gas distribution unit 5 distributing the purge gas. In this case, a process of purging the source gas may be performed by the purge gas distribution module 54 distributing the purge gas to the purge gas distribution space 540. The process of purging the source gas may be performed by distributing the purge gas to at least one of the first gas distribution space 510, the second gas distribution space 520, the third gas distribution space 530, and the purge gas distribution space 540. While the process of purging the source gas is being performed, the substrate supporting unit 3 may rotate the substrates S along the rotational path.

Subsequently, as illustrated in FIG. 19, a reactant gas is distributed to only the third gas distribution space 530. Such a process may be performed by only the third gas distribution module 53 distributing the reactant gas to the third gas distribution space 530. Therefore, a substrate processing process using the reactant gas distributed from the third gas distribution module 53 may be performed in the process chamber 2. While the process of distributing the reactant gas to only the third gas distribution space 530 is being performed, the substrate supporting unit 3 may rotate the substrates S along the rotational path. While the process of distributing the reactant gas to only the third gas distribution space 530 is being performed, the first gas distribution module 51, the second gas distribution module 52, and the purge gas distribution module 54 do not distribute a gas.

Subsequently, the reactant gas is purged. Such a process may be performed by the gas distribution unit 5 distributing the purge gas. In this case, a process of purging the reactant gas may be performed by the purge gas distribution module 54 distributing the purge gas to the purge gas distribution space 540. The process of purging the reactant gas may be performed by distributing the purge gas to at least one of the first gas distribution space 510, the second gas distribution space 520, the third gas distribution space 530, and the purge gas distribution space 540. While the process of purging the reactant gas is being performed, the substrate supporting unit 3 may rotate the substrates S along the rotational path.

Figure 20:
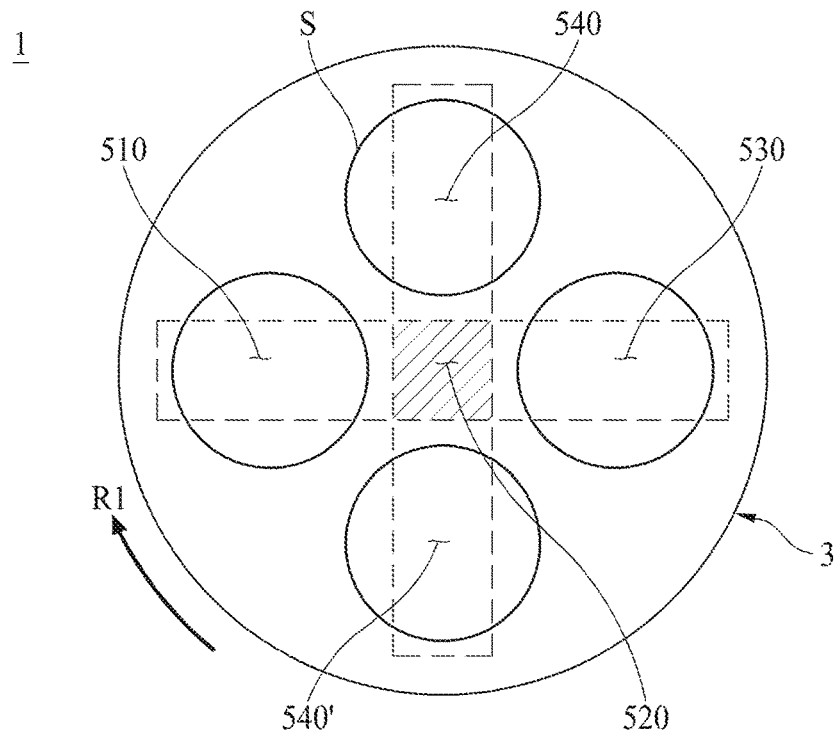
Figure 21:
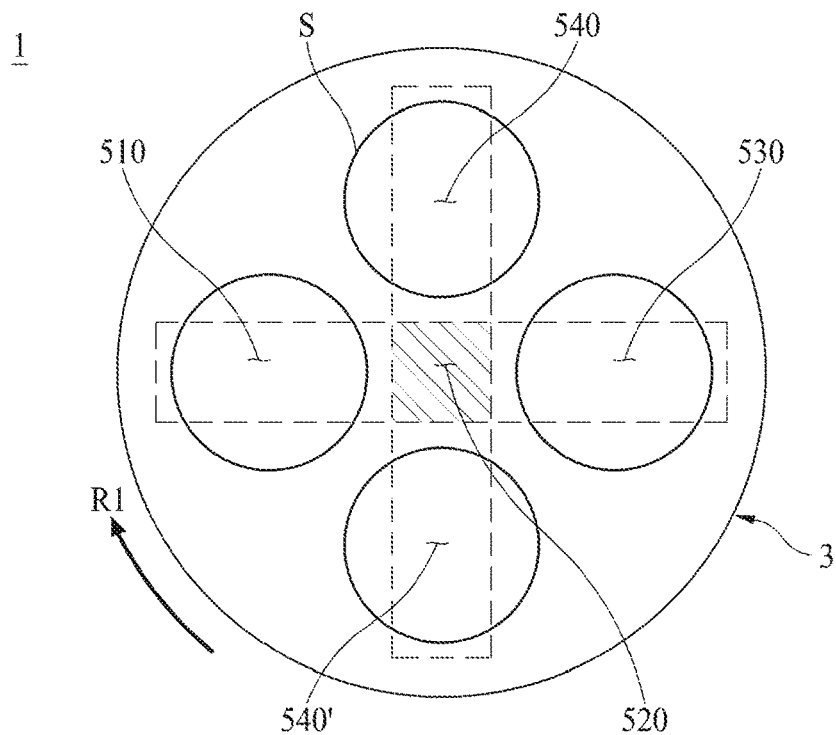

Referring to FIGS. 20 and 21, a time division processing process according to a second modification embodiment may include the following process. In FIGS. 20 and 21, a hatched portion is a space to which a process gas is directly distributed, and an unhatched portion is a space to which the process gas is not directly distributed.

First, as illustrated in FIG. 20, a source gas is distributed to only the second gas distribution space 520. Such a process may be performed by only the second gas distribution module 52 distributing the source gas to the second gas distribution space 520. Therefore, a substrate processing process using the source gas distributed from the second gas distribution module 52 may be performed in the process chamber 2. While the process of distributing the source gas to only the second gas distribution space 520 is being performed, the substrate supporting unit 3 may rotate the substrates S along the rotational path. While the process of distributing the source gas to only the second gas distribution space 520 is being performed, the first gas distribution module 51, the third gas distribution module 53, and the purge gas distribution module 54 do not distribute a gas.

Subsequently, the source gas is purged. Such a process may be performed by the gas distribution unit 5 distributing the purge gas. In this case, a process of purging the source gas may be performed by the purge gas distribution module 54 distributing the purge gas to the purge gas distribution space 540. The process of purging the source gas may be performed by distributing the purge gas to at least one of the first gas distribution space 510, the second gas distribution space 520, the third gas distribution space 530, and the purge gas distribution space 540. While the process of purging the source gas is being performed, the substrate supporting unit 3 may rotate the substrates S along the rotational path.

Subsequently, as illustrated in FIG. 21, a reactant gas is distributed to only the second gas distribution space 520. Such a process may be performed by only the second gas distribution module 52 distributing the reactant gas to the second gas distribution space 520. Therefore, a substrate processing process using the reactant gas distributed from the second gas distribution module 52 may be performed in the process chamber 2. While the process of distributing the reactant gas to only the second gas distribution space 520 is being performed, the substrate supporting unit 3 may rotate the substrates S along the rotational path. While the process of distributing the reactant gas to only the second gas distribution space 520 is being performed, the first gas distribution module 51, the third gas distribution module 53, and the purge gas distribution module 54 do not distribute a gas.

Subsequently, the reactant gas is purged. Such a process may be performed by the gas distribution unit 5 distributing the purge gas. In this case, a process of purging the reactant gas may be performed by the purge gas distribution module 54 distributing the purge gas to the purge gas distribution space 540. The process of purging the reactant gas may be performed by distributing the purge gas to at least one of the first gas distribution space 510, the second gas distribution space 520, the third gas distribution space 530, and the purge gas distribution space 540. While the process of purging the reactant gas is being performed, the substrate supporting unit 3 may rotate the substrates S along the rotational path.

Figure 22:
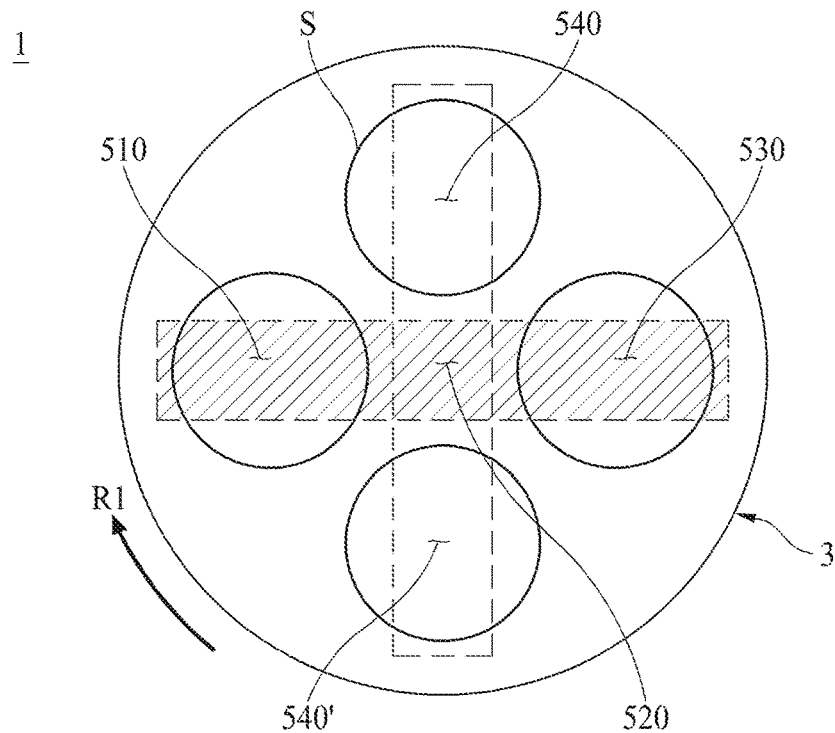
Figure 23:
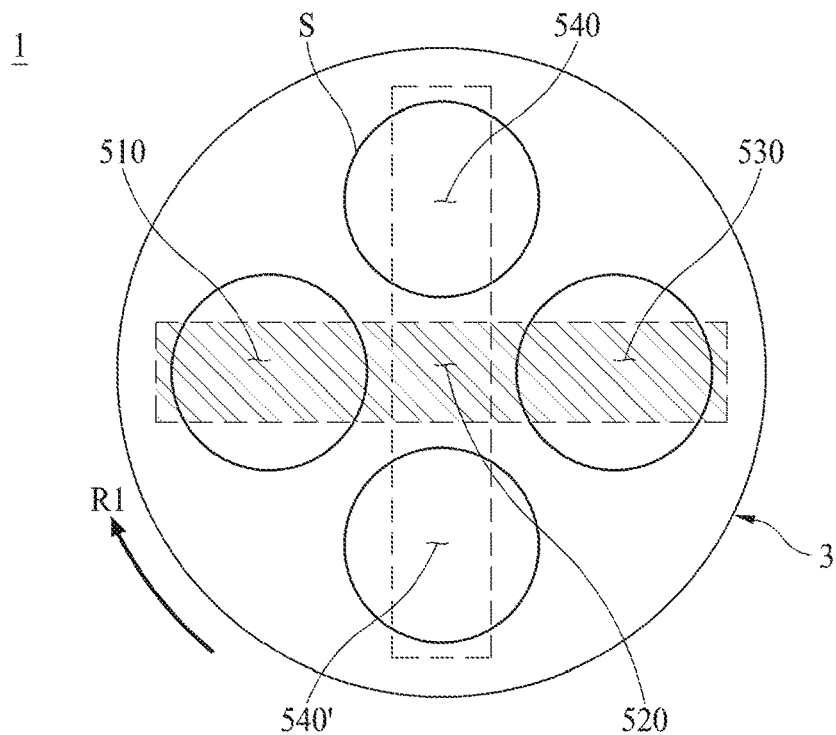

Referring to FIGS. 22 and 23, a time division processing process according to a third modification embodiment may include the following process. In FIGS. 22 and 23, a hatched portion is a space to which a process gas is directly distributed, and an unhatched portion is a space to which the process gas is not directly distributed.

First, as illustrated in FIG. 22, a source gas is distributed to all of the first gas distribution space 510, the second gas distribution space 520, and the third gas distribution space 530. Such a process may be performed by the first gas distribution module 51, the second gas distribution module 52, and the third gas distribution module 53 respectively distributing the source gas to the first gas distribution space 510, the second gas distribution space 520, and the third gas distribution space 530. Therefore, a substrate processing process using the source gas distributed from each of the first gas distribution module 51, the second gas distribution module 52, and the third gas distribution module 53 may be performed in the process chamber 2. While the process of distributing the source gas to all of the first gas distribution space 510, the second gas distribution space 520, and the third gas distribution space 530 is being performed, the substrate supporting unit 3 may rotate the substrates S along the rotational path. While the process of distributing the source gas to all of the first gas distribution space 510, the second gas distribution space 520, and the third gas distribution space 530 is being performed, the purge gas distribution module 54 does not distribute a gas.

Subsequently, the source gas is purged. Such a process may be performed by the gas distribution unit 5 distributing the purge gas. In this case, a process of purging the source gas may be performed by the purge gas distribution module 54 distributing the purge gas to the purge gas distribution space 540. The process of purging the source gas may be performed by distributing the purge gas to at least one of the first gas distribution space 510, the second gas distribution space 520, the third gas distribution space 530, and the purge gas distribution space 540. While the process of purging the source gas is being performed, the substrate supporting unit 3 may rotate the substrates S along the rotational path.

Subsequently, as illustrated in FIG. 23, a reactant gas is distributed to all of the first gas distribution space 510, the second gas distribution space 520, and the third gas distribution space 530. Such a process may be performed by the first gas distribution module 51, the second gas distribution module 52, and the third gas distribution module 53 respectively distributing the reactant gas to the first gas distribution space 510, the second gas distribution space 520, and the third gas distribution space 530. Therefore, a substrate processing process using the reactant gas distributed from each of the first gas distribution module 51, the second gas distribution module 52, and the third gas distribution module 53 may be performed in the process chamber 2. While the process of distributing the reactant gas to all of the first gas distribution space 510, the second gas distribution space 520, and the third gas distribution space 530 is being performed, the substrate supporting unit 3 may rotate the substrates S along the rotational path. While the process of distributing the reactant gas to all of the first gas distribution space 510, the second gas distribution space 520, and the third gas distribution space 530 is being performed, the purge gas distribution module 54 does not distribute a gas.

Subsequently, the reactant gas is purged. Such a process may be performed by the gas distribution unit 5 distributing the purge gas. In this case, a process of purging the reactant gas may be performed by the purge gas distribution module 54 distributing the purge gas to the purge gas distribution space 540. The process of purging the reactant gas may be performed by distributing the purge gas to at least one of the first gas distribution space 510, the second gas distribution space 520, the third gas distribution space 530, and the purge gas distribution space 540. While the process of purging the reactant gas is being performed, the substrate supporting unit 3 may rotate the substrates S along the rotational path.

The present inventive concept described above are not limited to the above-described embodiments and the accompanying drawings and those skilled in the art will clearly appreciate that various modifications, deformations, and substitutions are possible without departing from the scope and spirit of the invention.

The invention claimed is:
1. A substrate processing method of processing a substrate by distributing a processing gas inside a process chamber, the substrate processing method comprising:
  a time division processing process of processing the substrate in a time division mode of changing and distributing the processing gas in the process chamber with time; and
  a space division processing process of processing the substrate in a space division mode of distributing different processing gases to spaces of the process chamber, using a first gas distribution module to distribute a processing gas to a first gas distribution space, a second gas distribution module to distribute a processing gas to a second gas distribution space which is adjacent to the first gas distribution space, and a third gas distribution module to distribute a processing gas to a third gas distribution space which differs from each of the first gas distribution space and the second gas distribution space, wherein the time division processing process comprises distributing a source gas to the first gas distribution space and the second gas distribution space, distributing a purge gas to a purge gas distribution space and the second gas distribution space, and distributing a reactant gas to the third gas distribution space and the second gas distribution space, wherein the space division processing process comprises distributing the source gas to the first gas distribution space, distributing the purge gas to the second gas distribution space, and distributing the reactant gas to the third gas distribution space, and wherein the distributing of the source gas to the first gas distribution space in the space division processing process, the distributing of the purge gas to the second gas distribution space in the space division processing process, and the distributing of the reactant gas to the third gas distribution space in the space division processing process are simultaneously performed, wherein the distributing of the source gas to the first gas distribution space and the second gas distribution space in the time division processing process is performed by the first gas distribution module distributing the source gas to the first gas distribution space and simultaneously by the second gas distribution module distributing the source gas to the second gas distribution space, wherein the distributing of the purge gas to the purge gas distribution space and the second gas distribution space in the time division processing process is performed by a purge gas distribution module distributing the purge gas to the purge gas distribution space and simultaneously by the second gas distribution module distributing the purge gas to the second gas distribution space, and wherein the distributing of the reactant gas to the third gas distribution space and the second gas distribution space in the time division processing process is performed by the third gas distribution module distributing the reactant gas to the third gas distribution space and simultaneously by the second gas distribution module distributing the reactant gas to the second gas distribution space.

2. The substrate processing method of claim 1, further comprising a repetition processing process of alternately repeating the time division processing process and the space division processing process.

3. The substrate processing method of claim 1, wherein
the distributing of the source gas to the first gas distribution space in the space division processing process is performed by the first gas distribution module distributing the source gas to the first gas distribution space,
the distributing of the purge gas to the second gas distribution space in the space division processing process is performed by the second gas distribution module distributing the purge gas to the second gas distribution space, and
the distributing of the reactant gas to the third gas distribution space in the space division processing process is performed by the third gas distribution module distributing the reactant gas to the third gas distribution space.

4. The substrate processing method of claim 1, wherein
the space division processing process further comprises distributing the purge gas to the purge gas distribution space which differs from the first gas distribution space, the third gas distribution space, and the second gas distribution space, and
the distributing of the source gas to the first gas distribution space in the space division processing process, the distributing of the purge gas to the second gas distribution space in the space division processing process, the distributing of the reactant gas to the third gas distribution space in the space division processing process, and the distributing of the purge gas to the purge gas distribution space in the space division processing process are simultaneously performed.

5. The substrate processing method of claim 1, wherein the time division processing process further comprises the distributing of the purge gas to the purge gas distribution space and the second gas distribution space in the time division processing process is performed by the purge gas distribution module distributing the purge gas to the purge gas distribution space and simultaneously by the second gas distribution module distributing the purge gas to the second gas distribution space.

* * * * *